(12) United States Patent
Furuta

(10) Patent No.: US 7,468,539 B2
(45) Date of Patent: Dec. 23, 2008

(54) FIELD-EFFECT TRANSISTOR WITH A GATE HAVING A PLURALITY OF BRANCHING ELEMENTS ARRANGED PARALLEL TO EACH OTHER

(75) Inventor: Kenichi Furuta, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 368 days.

(21) Appl. No.: 10/982,916

(22) Filed: Nov. 8, 2004

(65) Prior Publication Data

US 2005/0269643 A1    Dec. 8, 2005

(30) Foreign Application Priority Data

Jun. 3, 2004    (JP) ............................. 2004-165893

(51) Int. Cl.
*H01L 27/088* (2006.01)
(52) U.S. Cl. ..................... 257/365; 257/266; 257/288; 257/331; 257/401
(58) Field of Classification Search ................ 257/250, 257/328, 365, 331, 270, 302, 266, 329, 401
See application file for complete search history.

(56) References Cited

U.S. PATENT DOCUMENTS

| | | | | |
|---|---|---|---|---|
| 3,786,319 A | * | 1/1974 | Tomisaburo ................ 257/365 |
| 5,043,779 A | * | 8/1991 | Nishimura ................. 257/339 |
| 5,621,234 A | * | 4/1997 | Kato ......................... 257/339 |
| 5,789,791 A | * | 8/1998 | Bergemont ................ 257/401 |
| 6,768,167 B2 | * | 7/2004 | Nagaoka et al. ........... 257/329 |
| 6,773,995 B2 | * | 8/2004 | Shin et al. ................. 438/270 |

FOREIGN PATENT DOCUMENTS

| | | |
|---|---|---|
| JP | 5-055584 | 3/1993 |
| JP | 5-055592 | 3/1993 |

* cited by examiner

*Primary Examiner*—Zandra Smith
*Assistant Examiner*—Candice Y Chan
(74) *Attorney, Agent, or Firm*—Rabin & Berdo, PC

(57) ABSTRACT

A field-effect transistor includes a substrate of a first conductivity type, and a channel diffusion region of a second conductivity type provided in the first conductivity type substrate. The transistor also includes a first conductivity type contact region provided in the second conductivity type channel diffusion region, and an electrode wiring connected to the first conductivity type source contact region and second conductivity type source contact region. A surface insulating film is provided on the second conductivity type channel diffusion region. A plurality of linear gate electrodes are provided on the surface insulating film. The gate electrodes are parallel to each other. The spacing between the gate electrodes is less than the thickness of the surface insulating film.

17 Claims, 11 Drawing Sheets

FIELD-EFFECT TRANSISTOR WITH A GATE HAVING A PLURALITY OF BRANCHING ELEMENTS ARRANGED PARALLEL TO EACH OTHER

BACKGROUND OF THE INVENTION

1. Field of the Invention

The present invention relates to a semiconductor element and a method for manufacture thereof, and more particularly to an insulated-gate field-effect transistor and a method for manufacture thereof.

2. Description of the Related Art

Insulated-gate field-effect transistors, which have a high voltage resistance and can operate at a large current, are known. Insulated-gate field-effect transistors are semiconductor elements. Vertical MOSFETs (Vertical Double-Diffusion MOS: also referred to hereinbelow simply as VDMOSFET) are known as such semiconductor elements.

There is a risk of breakdown in the VDMOSFET due to an overcurrent caused by rapid changes in the drain voltage thereof. The VDMOSFET developed with the object of preventing this breakdown, that is, improving the so called dv/dt breakdown resistance, have been suggested in, for example, Japanese Patent Kokai (Laid-open Application) No. 5-055592. With such VDMOSFET, the breakdown resistance is improved by preventing the formation of a parasitic transistor in the corner portion of the base layer. Also, the degree of integration is increased by using the base layer whose plane surface has a square or substantially square shape. The chip size can be reduced if the degree of integration increases.

Japanese Patent Kokai (Laid-open Application) No. 5-055584 discloses another method of fabricating the VDMOSFET. This VDMOSFET fabrication method is carried out without the mask alignment process. The mask alignment process is executed when forming a contact hole. This VDMOSFET fabrication method also eliminates the defects of step coverage caused by the steps in the contact holes. In this VDMOSFET fabrication method, the entire surface of the semiconductor substrate is covered with a phosphorus-doped oxide film, reflow is conducted, the phosphorus-doped oxide film and gate insulating film are etched over the entire surface till the silicon semiconductor substrate on the source diffusion region is exposed, and the contact hole is self-alignment formed.

SUMMARY OF THE INVENTION

For example, with the VDMOSFET disclosed in Japanese Patent Kokai Nos. 5-055584 and 5-055592, the surface area occupied by the gate electrode on the cell is large. Therefore, the gate-source capacitance (hereinbelow sometimes simply referred to as Cgs) and gate-drain capacitance (hereinbelow sometimes simply referred to as Cgd) increase. As a result, it is difficult to operate the VDMOSFET with a higher speed. If such a VDMOSFET is to be operated with a high speed, the gate electrode width (gate width) has to be decreased. However, when the gate electrode width is decreased, a large current is difficult to pass between the drain and the source because the electric current flowing between the drain and the source is proportional to the gate width. Thus, with the conventional VDMOSFET, it is very difficult to realize both the operation with a higher speed and the operation at a larger current.

Therefore, a technology for realizing an insulated-gate field-effect transistor that can operate at a large current and a higher speed has been expected.

According to one aspect of the present invention, there is provided an improved field-effect transistor. This field-effect transistor includes a substrate of a first conductivity type. A channel diffusion region of a second conductivity type is provided in the substrate. A first source contact region of the first conductivity type is provided in the channel diffusion region. A second source contact region of the second conductivity type is provided in the first source contact region. An electrode wiring is connected to the first source contact region and second source contact region. A surface insulating film is provided on the channel diffusion region. A plurality of linear gate electrodes are provided on the surface insulating film and arranged parallel to each other. Spacing between the gate electrodes is smaller than a thickness of the surface insulating film.

Since the field-effect transistor has such linear gate electrodes, it is possible to reduce the gate-source capacitance and the gate-drain capacitance. Consequently, the semiconductor element can be operated at a large electric current. Also, the semiconductor element can be operated at a high speed.

According to another aspect of the present invention, there is provided an improved method of manufacturing a field-effect transistor. This method includes forming a surface insulating film on a surface of a substrate, and forming a plurality of linear gate electrodes on the surface insulating film. Spacing between the gate electrodes is less than a thickness of the surface insulating film. The method also includes forming a channel diffusion region of a second conductivity type in the substrate below the linear gate electrodes. The method also includes forming a first source contact region of the first conductivity type and a second source contact region of the second conductivity type inside the channel diffusion region. The method also includes forming an intermediate insulating film, which covers the substrate and the gate electrodes. The method also includes forming a contact hole in the intermediate insulating film. The method also includes forming an electrode wiring connected to the first source contact region and the second source contact region inside the contact hole.

Since the field-effect transistor has such linear gate electrodes, it is possible to reduce the gate-source capacitance and the gate-drain capacitance. Consequently, the semiconductor element made by this manufacturing method can be operated at a large electric current. Also, this semiconductor element can be operated at a high speed.

These and other objects, aspects and advantages of the present invention will become apparent to those skilled in the art from the following detailed description and appended claims when read and understood in conjunction with the accompanying drawings.

DETAILED DESCRIPTION OF THE INVENTION

Figure 1A:
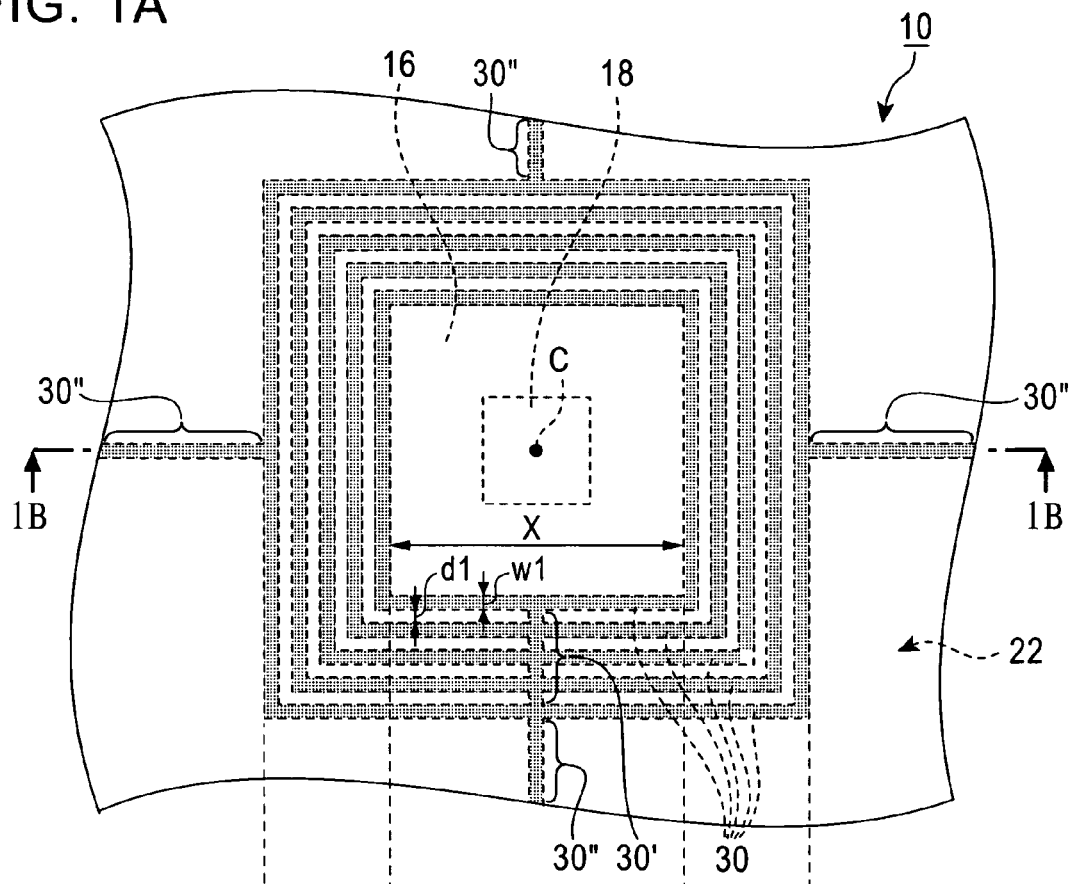
FIG. 1A is a schematic plan view of a semiconductor element according to a first embodiment of the present invention.

Preferred embodiments of the present invention will be described hereinbelow with reference to the accompanying drawings. In the drawings, the shape, size and mutual arrangement of constituent components are shown schematically, merely to the extent allowing the present invention to be understood, and the present invention is not particularly limited thereto. In the plan views, the parts provided above the gate electrodes are omitted and the underlying parts are depicted to facilitate the explanation of the configuration of the gate electrodes. The gate electrodes are the main feature of the present invention. In the description presented below, specific materials, conditions, and numerical conditions are used, but they represent nothing more than one preferred example and hence the present invention is not limited thereto.

First Embodiment:

1-1-1. Configuration of Semiconductor Element

The configuration of a semiconductor element 10 in accordance with the present invention will be described below with reference to FIG. 1A and FIG. 1B.

Figure 1B:
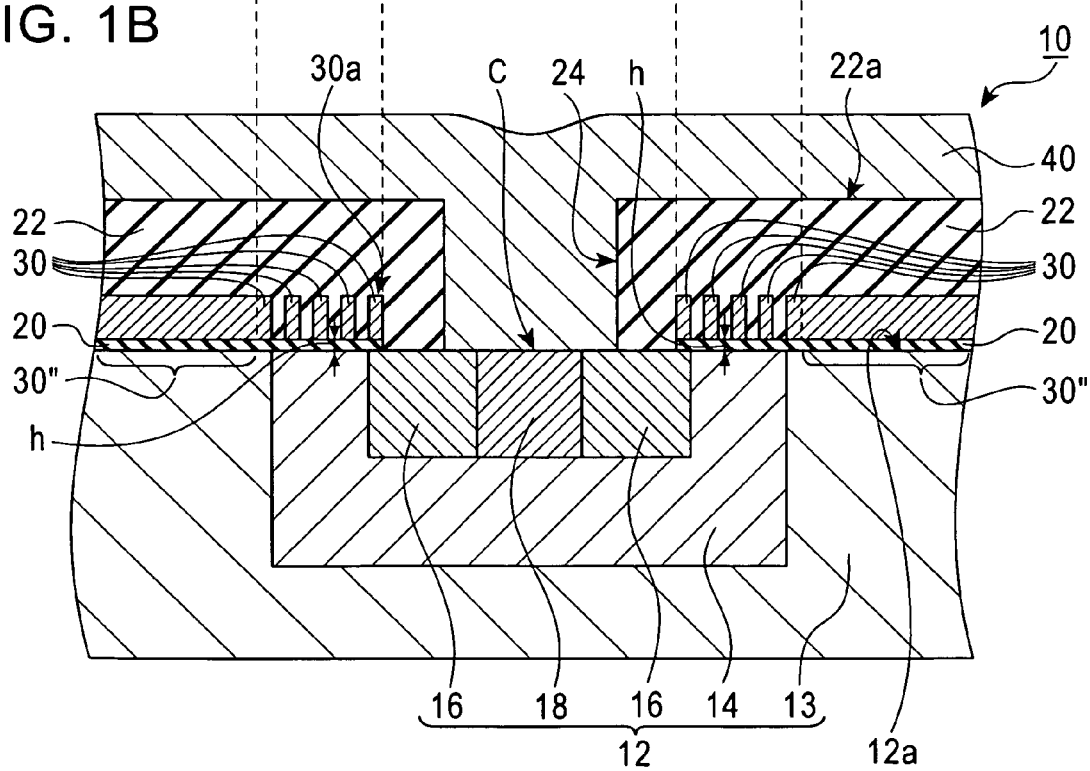
FIG. 1B is a cross-sectional view taken along the line 1B-1B in FIG. 1A.

One representative semiconductor element 10 of multiple semiconductor elements formed simultaneously on a substrate is shown in FIG. 1A and FIG. 1B.

FIG. 1A is a schematic plan view showing constituent parts of the semiconductor element 10, and FIG. 1B is a cross sectional view.

As shown in FIGS. 1A and 1B, the semiconductor element 10 includes a substrate 12 of the first conductivity type. In this embodiment, the substrate 12 is an N-type substrate.

The substrate 12 of the first conductivity type is provided with a channel diffusion region 14 of the second conductivity type. In this embodiment, the channel diffusion region 14 is a P-type channel diffusion region. This channel diffusion region 14 is surrounded by an N-type region, that is, a region 13 of the first conductivity type.

An $N^+$-type source contact region is provided, as a source contact region 16 of the first conductivity type, in the channel diffusion region 14 of the second conductivity type. The source contact region 16 is in the form of a substantially rectangular parallelepiped with a square top surface. The center C of this square matches the center C of the channel diffusion region 14. This central point C is also the central point of the semiconductor element 10.

The top surface of the source contact region 16 is present in the same plane with a surface 12a of the substrate 12. The source contact region 16 of the first conductivity type is surrounded by the channel diffusion region 14 of the second conductivity type.

A source contact region 18 of the second conductivity type is provided in the source contact region 16 of the first conductivity type. In this embodiment, the source contact region 18 is a $P^+$-type source contact region. The source contact region 18 is in the form of a substantially rectangular parallelepiped with a square top surface. The central point C of this square matches the central point C of the source contact region 16.

A surface insulating film 20 functioning as a gate oxidation film is provided on the P-type channel diffusion region 14 exposed in the same plane with the surface 12a of the substrate 12. The surface insulating film 20 is provided from the source contact region 16 over the region 13 of the first conductivity type so as to surround the source contact region 18. The surface insulating film 20 has a linear closed loop shape surrounding the source contact region 18. In this embodiment, the contour of the loop has a rectangular shape.

As shown in FIG. 1B, the thickness of the surface insulating film 20 is denoted by h.

A plurality of linear gate electrodes 30 are provided on the surface insulating film 20. Each of the gate electrodes 30 has a closed-loop shape. The electrodes 30 are concentrical about the central point C of the source contact region 18. Thus, the gate electrodes 30 surround the central point C in a multiple fashion with a spacing therebetween.

In the illustrated embodiment, five linear gate electrodes 30 are arranged in parallel to each other.

The gate electrodes 30 have a width w1. The width w1 is measured in the direction perpendicular to the extending direction of the gate electrodes 30.

The width w1 of each gate electrode 30 can be selected according to the desired performance of the semiconductor element, rules of the manufacturing process, and the like. In this embodiment, all the gate electrodes 30 have the same width w1.

The five gate electrodes 30 are provided with a spacing therebetween; in this embodiment, the spacing d1 between all the adjacent gate electrodes is the same to facilitate the implementation of the manufacturing process. However, different spacing d1 may be provided depending upon the desired performance of the semiconductor element, rules of the manufacturing process, and the like.

From the standpoint of increasing the operation speed of the semiconductor element, it is preferred that the spacing d1 be as small as possible. If the spacing d1 is more than a value obtained by multiplying the thickness h of the surface insulating film by $2^{1/2}$, a sufficient reversion of conductivity type does not proceed in the regions directly below the linear gate electrodes 30 when a voltage is applied to the gate electrodes 30. As a result, there is a risk that the semiconductor element will not operate properly. If the spacing d1 is too large, the operation speed of the semiconductor element cannot be increased.

Therefore, it is preferred that the spacing d1 be less than a value obtained by multiplying the thickness h of the surface insulating film 20 by $2^{1/2}$. With the object of facilitating the implementation of the manufacturing process, it is preferred that the spacing d1 be equal to the thickness h of the surface insulating film 20. It is even more preferred that the spacing d1 be less than the thickness h of the surface insulating film 20.

In order to stabilize the threshold voltage of the semiconductor element, the height (thickness) of the gate electrodes 30 is preferably as large as possible. If gate electrodes 30 with a larger height can be formed, then the threshold voltage can be stabilized and an electric resistance can be decreased.

The linear gate electrodes 30 are connected to each other by linking portions 30'. The linking portions 30' are employed to stabilize the potential of each of the gate electrodes 30 at a constant value.

As shown in FIG. 1A, only one linking portion 30' is provided in this embodiment, but the present invention is not limited in this regard. For example, there may be provided a plurality of linking portions 30' extending radially inward, that is, in a net-like fashion toward the central point C of the source contact region 18. With such a configuration, a uniform voltage on all the gate electrodes 30 can be obtained more efficiently, thereby making it possible to stabilize the operation and increase the operation speed of the semiconductor element 10.

One end of a connecting portion 30" is connected to the outermost one of the gate electrodes 30. The other end of the connecting portion 30" is connected to a gate electrode of the adjacent semiconductor element (not shown in the figure). Generally, VDMOSFET is suited for integration so that a large number of semiconductor elements are formed simultaneously on a substrate. In this embodiment, four ends of the connecting portions 30" are connected to four other semiconductor elements (not shown in the figures) present on the top and bottom sides and on the right and left sides of the semiconductor element 10. The surface insulating film 20 extends at least below the linking portion 30'.

The connecting portions 30" are provided to drive the adjacent semiconductor elements simultaneously.

The gate electrodes 30, linking portion 30', and connecting portions 30" are provided integrally. Similar to the gate electrodes 30 and linking portion 30', the connecting portions 30" are electrically insulated from the N$^-$-type region 13 by the surface insulating film 20.

An intermediate insulating film 22 is provided on the surface 12a of the substrate 12, gate electrodes 30, and surface insulating film 20 exposed from the gate electrodes 30, so as to cover them.

A contact hole 24 is provided in the intermediate insulating film 22 such that the contact hole 24 extends from the surface 22a of the intermediate insulating film 22 and reaches the source contact region 18 and part of the source contact region 16. In this embodiment, the contact hole 24 is formed so as to expose the boundary of the source contact region 18 and source contact region 16.

An electrode wiring 40 for filling the contact hole 24 is provided on the intermediate insulating film 22.

In the semiconductor element (field-effect transistor) in accordance with the present invention, the region 13 of the first conductivity type functions as a drain, the upper portion of the channel diffusion region 14 of the second conductivity type functions as a channel, and the source contact region 16 of the first conductivity type functions as a source.

Thus, if a voltage above a threshold value is applied to the gate electrodes 30, then an electric current will flow in the direction from the region 13, which is a drain, to the source contact region 16.

As described above, the semiconductor element 10 in accordance with the present invention has a plurality of linear gate electrodes. Therefore, the so-called gate-source capacitance and gate-drain capacitance can be decreased. Thus, the semiconductor element can be operated at a high current. The operation speed of the semiconductor element can also be increased.

1-1-2. Method for Manufacture of Semiconductor Element

A method for the manufacture of the semiconductor element 10, which was described with reference to FIGS. 1A and 1B, will be described with reference to FIGS. 2A to 2C and FIGS. 3A and 3B.

Figure 2A:
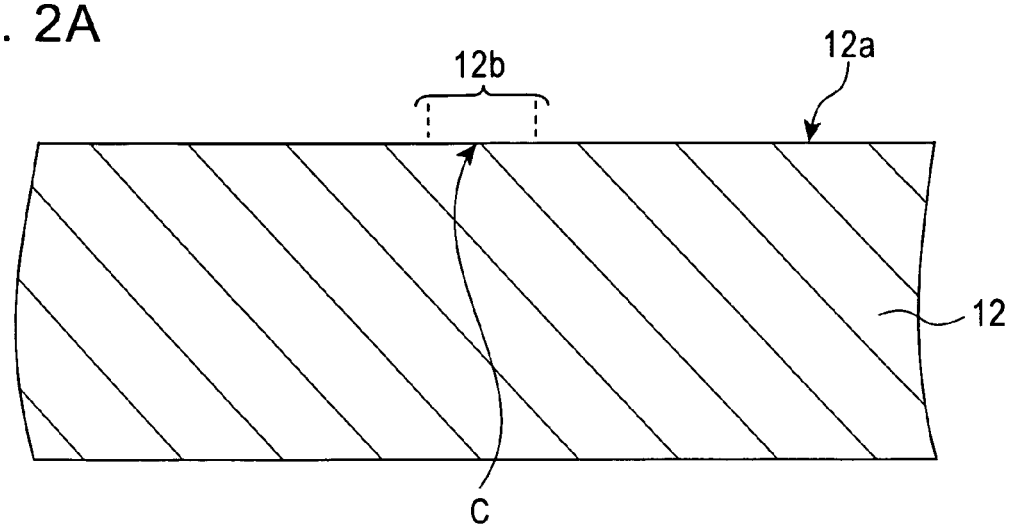
FIGS. 2A, 2B, 2C, 3A and 3B are a series of cross-sectional views of the semiconductor element, taken along the same line as the line 1B-1B in FIG. 1A, to show manufacturing steps.
Figure 2B:
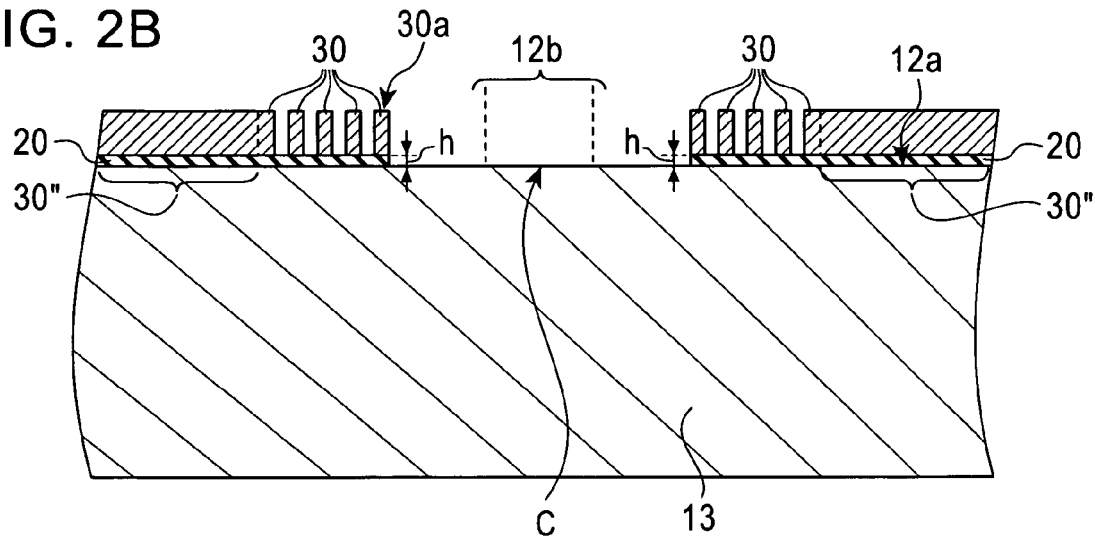
Figure 2C:
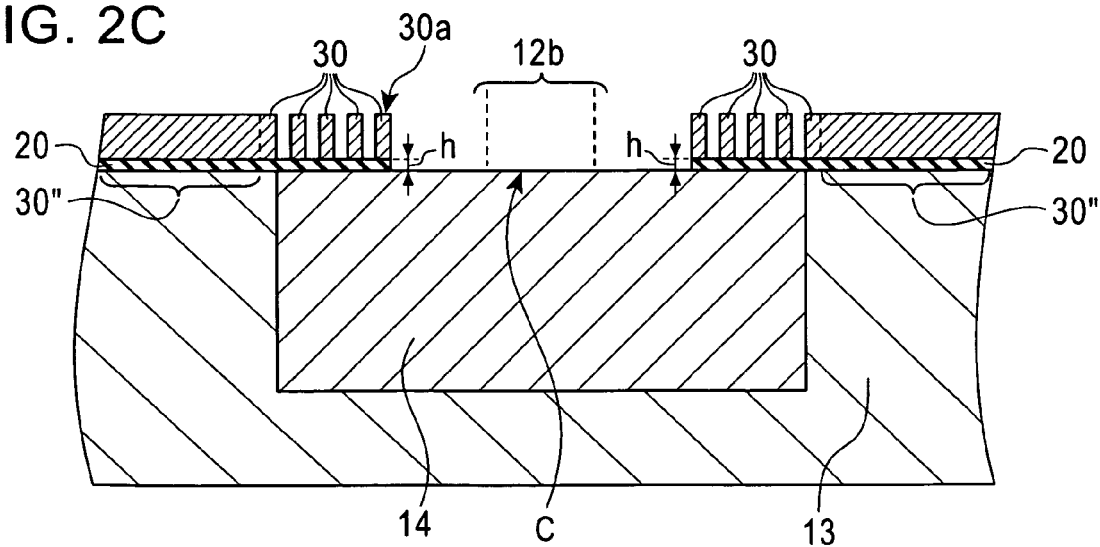

FIGS. 2A, 2B, and 2C are schematic cross sectional views of the semiconductor element in the manufacturing process, this cut being made in the same position as that of the dash-dot line 1B-1B in FIG. 1A.

Figure 3A:
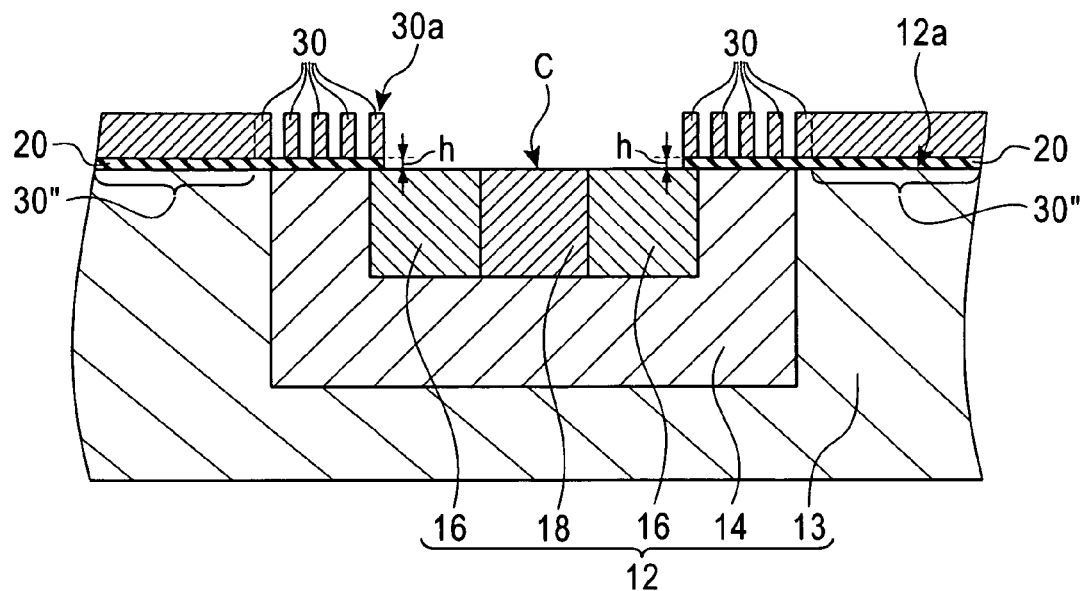
Figure 3B:
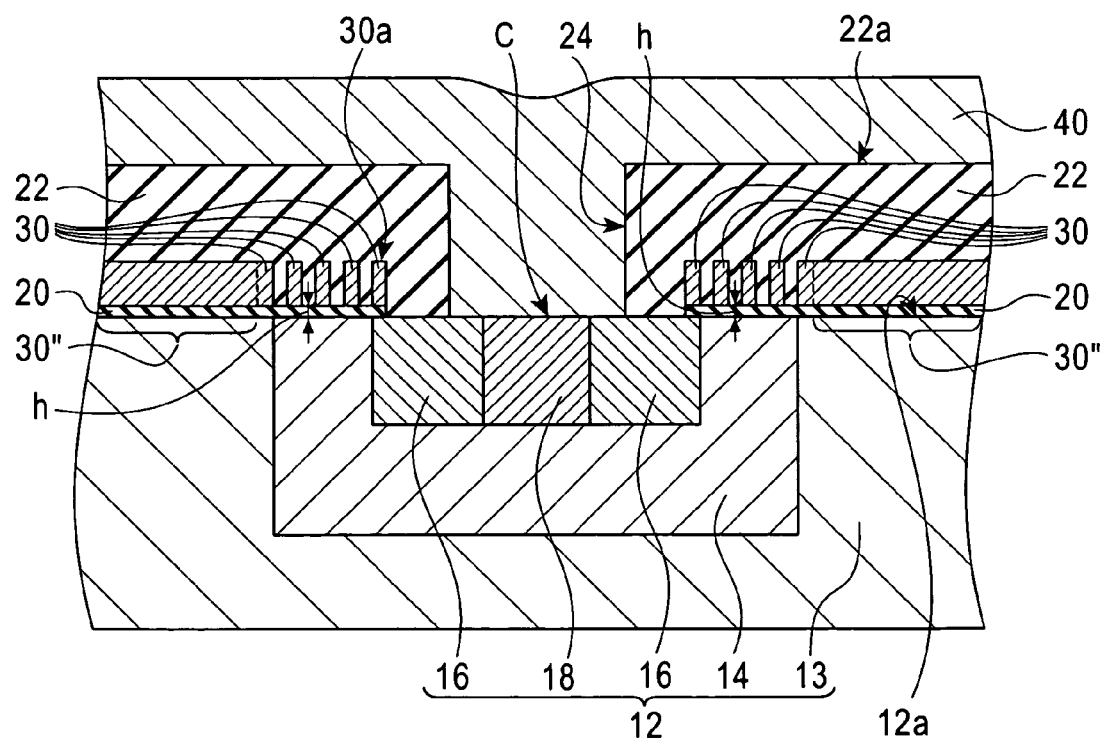

FIGS. 3A and 3B are similar cross sectional views, showing the subsequent manufacturing steps after FIG. 2C.

As described hereinabove, the shape of the gate electrodes is a specific feature of the semiconductor element 10. In other aspects, the configuration is the same as that of the conventional VDMOSFET. The manufacturing process for the semiconductor element 10 is also similar to a conventional manufacturing process except for the step implemented to form the gate electrodes. Therefore, detailed explanation of the steps other than those employed for forming the gate electrodes will be omitted.

First, as shown in FIG. 2A, a substrate 12 of the first conductivity type is prepared. A region where the semiconductor element 10 will be formed is set as a preset region on the substrate 12. In the figure, only a preset region 12b which will become the source contact region 18 of the second conductivity type is shown. The central point of the preset region 12b, that is, the central point of the semiconductor element 10 is denoted by symbol C.

Then, as shown in FIG. 2B, a surface insulating film (pattern) 20 in the form of a closed loop (rectangular contour in the illustrated embodiment) is formed on the surface of the substrate 12 by conducting a conventional thermal oxidation treatment in an oxygen atmosphere. The surface insulating film 20 is, for example, a SiO$_2$ film.

Then, gate electrodes 30 are formed on the surface insulating film 20 by, for example, a conventional CVD process, photolithography process and dry etching process. It is preferred that polysilicon be used as a material for the gate electrodes 30. It is also possible to use, for example, aluminum (Al) and tungsten (W) to form the gate electrodes with a conventional patterning process.

A plurality of gate electrodes 30 of a linear shape are formed. Each linear gate electrode 30 has a width less than the width of the loop with a rectangular contour of the surface insulating film 20. Each linear gate electrode 30 is formed to have a closed loop shape. In this embodiment, the linear gate electrodes 30 are formed parallel to each other with the same spacing therebetween.

The gate electrodes 30, linking portion 30', and connecting portions 30" are formed as a single continuous pattern in the same (single) process and from the same material.

Similar to the gate electrodes 30 and linking portion 30', the connecting portions 30" are electrically insulated from the N$^-$-type region 13 by the surface insulating film 20.

Then, ion implantation is conducted into the substrate 12 by using a mask (not shown in the figures) which opens only the region (shown as region X in FIG. 1A) surrounded by the gate electrodes 30, that is, the region inside the innermost gate electrode 30. This mask can be formed as a resist pattern by a photolithography process with an organic resist material.

Then ion implantation is conducted into the substrate 12. This ion implantation process can be implemented by using a conventional ion implantation apparatus which implants boron (B) (i.e., P-type dopant) at a dose of $1\times10^{12}$ to $1\times10^{14}$ ions/cm$^2$ and an energy of 10 to 90 keV. The threshold voltage of the resulting semiconductor element 10 can be controlled to any desired value by adjusting the dose.

The mask is removed after the ion implantation is completed.

Subsequently, the implanted ions are caused to diffuse to part of the region below the linear gate electrodes (patterns) 30 by conducting thermal diffusion for 10 to 90 minutes at a temperature of 1200° C.

The channel diffusion region 14 of the second conductivity type is thus formed (FIG. 2C).

Then, as shown in FIG. 3A, the source contact region 16 of the first conductivity type is formed inside the channel diffusion region 14 of the second conductivity type by the conventional implantation process and diffusion process.

When this ion implantation is conducted, a resist pattern (not shown in the figures) is formed by the photolithography process to cover the gate electrodes 30, the region outside the gate electrodes 30 and the source contact preset region 12b, which is separated from the gate electrodes 30 and is located inside the gate electrodes 30. The ion implantation process is implemented by using this resist pattern as a mask.

This ion implantation process can be implemented, for example, by implanting phosphorus (P), which is a N-type dopant, at a dose of $1\times10^{14}$ to $1\times10^{16}$ ions/cm$^2$ and an energy of 10 to 90 keV. By this process, ions are caused to diffuse to part of the region below the linear gate electrodes 30 and within the channel diffusion region 14. After the thermal diffusion process is completed, the mask is removed. The source contact region 16 of the first conductivity type is thus formed.

Then, the source contact region 18 of the second conductivity type is formed by the ion implantation process and thermal diffusion process.

When this ion implantation is conducted, a resist pattern (not shown in the figure) for exposing the source contact preset region 12b is formed by a conventional photolithography process. Ion implantation and thermal diffusion process are then conducted so that the ions reach the region 13 of the substrate 12 by using this resist pattern as a mask. After the thermal diffusion process is completed, the mask is removed.

This ion implantation process can be implemented, for example, by implanting boron (B), which is a N-type dopant, at a dose of $1\times10^{14}$ to $1\times10^{16}$ ions/cm$^2$ and an energy of 10 to 90 keV.

With this process, the source contact region 18 of the second conductivity type is formed and spaced from the gate electrodes 30 (FIG. 3A).

The intermediate insulating film 22 is then formed to cover the gate electrodes 30, surface insulating film 20 exposed from the gate electrodes 30, and surface 12a of the substrate 12. The intermediate insulating film 22 is formed by a CVD method with SiO$_2$ or SiN. The intermediate insulating film 22 is formed so as to fill the gaps between the linear gate electrodes 30.

Then, a contact hole 24 is formed from the surface of the intermediate insulating film 22 by a usual method so as to expose the source contact region 18 and part of the source contact region 16 (i.e., the source contact region 18 and the entire boundary of the source contact region 18 and the source contact region 16).

The electrode wiring 40 for filling the contact hole 24 is formed on the intermediate insulating film 22 by a conventional formation process (FIG. 3B).

With the method for the manufacture of the semiconductor element in accordance with the present invention, the semiconductor element demonstrating the above-described effect can be manufactured with good efficiency.

Modification to First Embodiment:

1-2-1. Configuration of Semiconductor Element

A modification to the semiconductor element of the first embodiment will be described with reference to FIGS. 4A and 4B. The constituent elements similar or identical to the constituent elements that have already been described in the first embodiment are assigned with the same reference symbols and detailed explanation thereof is omitted. The materials and conditions in the manufacturing process of this modified embodiment are substantially identical to those of the first embodiment, and detailed explanation thereof is herein omitted.

Figure 4A:
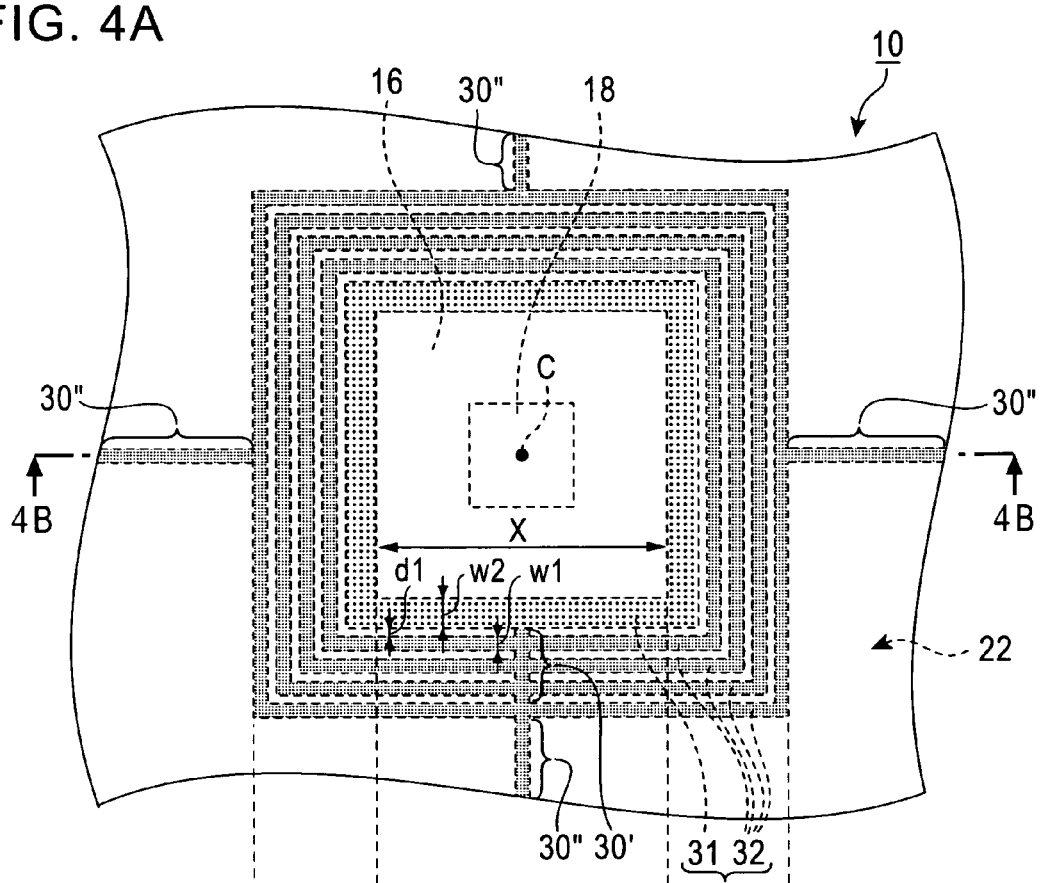
FIG. 4A is a schematic plan view of a semiconductor element according to a modified embodiment.

FIG. 4A is a schematic plan view of constituent elements of the semiconductor element 10 according to the modification embodiment. In particular, FIG. 4A shows the shape of gate electrodes 30.

Figure 4B:
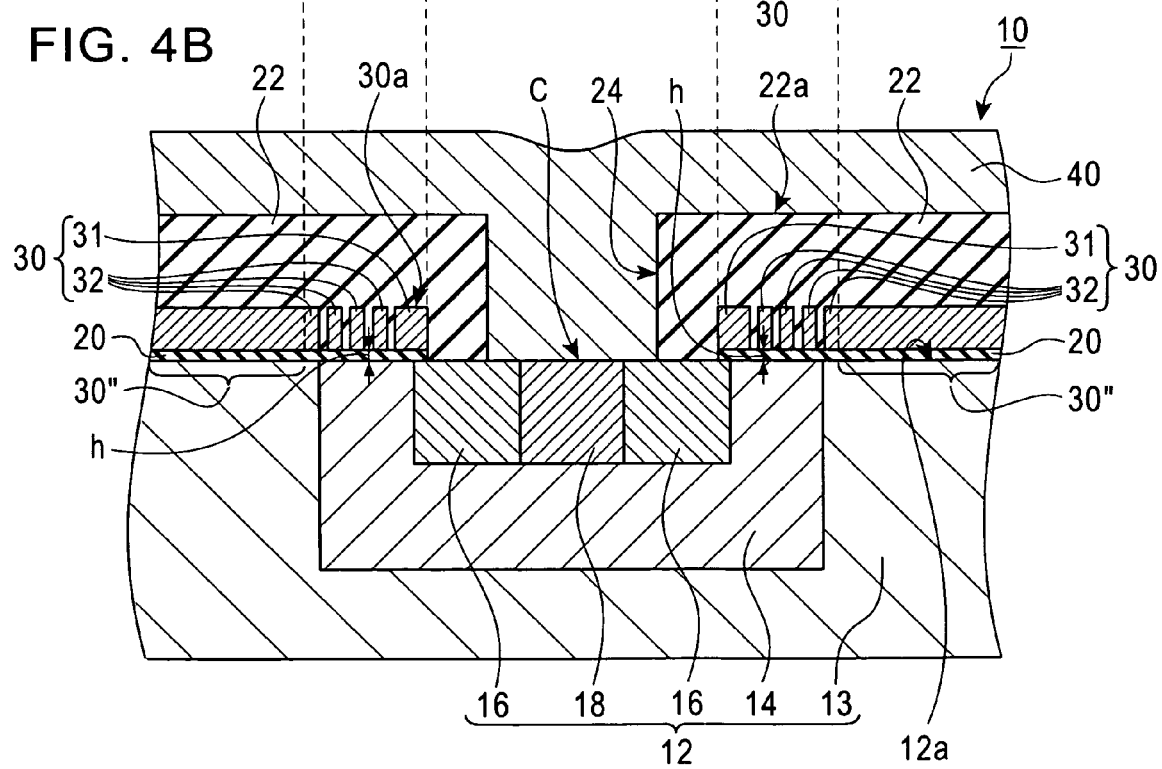
FIG. 4B is a cross-sectional view taken along the line 4B-4B in FIG. 4A.

FIG. 4B is a schematic cross sectional view, cut along the dash-dot line 4B-4B in FIG. 4A.

The configuration of the semiconductor element 10 of this modification differs from the configuration of the semiconductor element of the first embodiment of FIGS. 1A and 1B only in the shape of gate electrodes 30. Other features of the configuration are substantially the same. Therefore only this difference will be described in greater detail.

As shown in FIGS. 4A and 4B, the semiconductor element 10 of this modification is formed on a substrate 12 of the first conductivity type. A channel diffusion region 14 of the second conductivity type is provided in the substrate 12 of the first conductivity type. This channel diffusion region 14 is surrounded by a region 13 of the first conductivity type on the perimeter thereof, except a surface 12a of the substrate 12.

A source contact region 16 of the first conductivity type is provided in the channel diffusion region 14 of the second conductivity type.

Another source contact region 18 of the second conductivity type is provided in the source contact region 16 of the first conductivity type.

A surface insulating film 20 is provided on the channel diffusion region 14 which is exposed in the same plane with the surface 12a of the substrate 12.

A plurality of linear gate electrodes 30 are provided on the surface insulating film 20. Of the gate electrodes 30, the electrode positioned on the innermost side is called a first gate electrode 31, and one or a plurality of electrodes positioned on the outside of the first gate electrode 31 is called a second gate electrode 32. A plurality of second gate electrodes 32 are spaced from each other and surround the central point C in a multiple fashion concentrically. Each of the first gate electrode 31 and second gate electrodes 32 has a width less than the width of the surface insulating film 20. The second gate electrodes 32 are spaced from the first gate electrode 31 concentrically around the central point C. The second gate electrodes 32 have a closed shape loop. The width w1 of the second gate electrodes 32 is less than the width w2 of the first gate electrode 31. The width w2 of the first gate electrode 31, for example, may be set larger than the so-called alignment margin of an exposure apparatus used in the manufacturing process.

The width w2 and w1 are measured in the direction perpendicular to the extending direction of the first and second gate electrodes 31 and 32, respectively.

Four second gate electrodes 32 are illustrated. The width w1 of each of the second gate electrodes 32 can be decided according to the desired performance of the semiconductor element, rules of the manufacturing process, and the like. In this modified embodiment, all the second gate electrodes 32 have the same width w1.

As a general guideline, an example of the widths w1 and w2 will be described below. If the surface insulating film 20 has a rectangular loop with the width of 1000 nm (nanometers), the width w2 of the first gate electrode 31 is set to 200 nm and the width w1 of each second gate electrodes 32 is set to 60 nm. Therefore, the w1:w2 ratio is preferably about 3:10 based on the w2 that will be determined from the alignment margin of the exposure machine.

The spacing between the second gate electrode 32 and the first gate electrode 31 and the spacing between the adjacent second gate electrodes 32 are the same, i.e., the value d1. This spacing d1 can be decided according to the desired performance of the semiconductor element, rules of the manufacturing process, and the like. In this embodiment, the spacing d1 is about 140 nm.

The second gate electrode 32 is linked to the first gate electrode 31 and the second gate electrodes 32 are linked to each other by a linking portion 30'.

One end of a connecting portion 30" is connected to the outermost gate electrode 32 of the second gate electrodes 32. The other end of the connecting portion 30" is connected to a gate electrode of the adjacent semiconductor element (not shown in the figure). Similar to the gate electrode 30 and linking portion 30', the connecting portion 30" is electrically insulated from the N$^-$-type region 13 by the surface insulating film 20.

An intermediate insulating film 22 is provided above the surface 12a of the substrate 12, gate electrodes 30, and surface insulating film 20 exposed from the gate electrodes 30, so as to cover those components.

A contact hole 24 is provided in the intermediate insulating film 22 such that the contact hole 24 extends from the surface 22a of the intermediate insulating film 22 and reaches the source contact region 18 and part of the source contact region 16.

An electrode wiring 40 for filling the contact hole 24 is provided on the intermediate insulating film 22.

With the configuration of this modification example, it is possible to obtain an effect identical to that of the semiconductor element 10 of the first embodiment. Further, the first gate electrode 31 which is wider than the alignment margin of the exposure apparatus makes it possible to conduct ion implantation with better reliability. Therefore, degradation of voltage resistance can be prevented by comparison with the semiconductor element of the first embodiment.

1-2-2. Method for Manufacture of Semiconductor Element

A method for manufacturing the semiconductor element 10 of the modification example of FIGS. 4A and 4B will be described below. The materials and conditions in the manufacturing steps other than the step of forming the gate electrodes 30 are identical to those of the first embodiment of FIGS. 2A, 2B, 2C, 3A and 3B. Therefore, detailed explanation thereof is omitted.

Similar to the first embodiment, a substrate 12 of the first conductivity type is prepared. In this process, a region where the semiconductor element 10 will be formed is set as a preset region on the substrate 12.

Then, a surface insulating film 20 in the form of a closed loop is formed on the surface of the substrate 12 by conducting a conventional thermal oxidation treatment in an oxygen atmosphere.

Subsequently, gate electrodes 30 are formed on the surface insulating film 20, for example, by a CVD process, photolithography process and dry etching process, preferably, with polysilicon as a material for the gate electrodes. The mask (e.g., resist) used in this process may have a shape that allows the formation of the first gate electrode 31 and one or a plurality of second gate electrodes 32.

Similar to the first embodiment, the first and second gate electrodes 31 and 32, linking portion 30', and connecting portions 30" are formed as a single continuous pattern in the same process and from the same material.

Then, similar to the first embodiment, ion implantation is conducted into the substrate 12 by using a mask that opens only the region (shown as region X in FIG. 4A) surrounded by the gate electrodes 30, that is, the region on the inside of the first gate electrode 31.

The first gate electrode 31 of this modified embodiment is wider than the alignment margin of the mask. Therefore, even if the formation position of the mask pattern is displaced to a certain extent, the displacement can be absorbed by the width w2 which is larger than the alignment margin. Thus, even if the formation position of the mask pattern was displaced and the first gate electrode 31 was exposed, the first gate electrode 31 itself functions as part of the mask pattern with respect to this exposed portion. Therefore, the possibility of appropriately conducting the ion implantation is increased. As a consequence, the yield of produced semiconductor elements 10 and, therefore, the yield of semiconductor devices having the semiconductor elements 10 integrated therein can be increased.

The ion implantation and thermal diffusion can be implemented under the same conditions as those of the first embodiment.

The mask is removed after the thermal diffusion process is completed.

The channel diffusion region 14 of the second conductivity type, source contact region 16, and source contact region 18 are then successively formed by the same processes as used in the first embodiment.

Similar to the first embodiment, the intermediate insulating film 22 is formed so as to cover the gate electrodes 30, surface insulating film 20 exposed from the gate electrodes 30, and the surface 12a of the substrate 12. The intermediate insulating film 22 is formed so as to fill the gaps between the first gate electrode 31 and second gate electrodes 32 and the gaps between the second gate electrodes 32 themselves.

The contact hole 24 is then formed in the same manner as in the first embodiment.

The electrode wiring 40 for filling the contact hole 24 is then formed on the intermediate insulating film 22 by a common formation process.

The semiconductor element 10 of the modified embodiment is thus formed.

Second Embodiment:

2-1. Configuration of Semiconductor Element

The configuration of the semiconductor element 10 of the second embodiment will be described with reference to FIGS. 5A and 5B. The constituent elements similar or identical to the constituent elements that have already been described in the first embodiment are assigned with the same reference symbols and detailed explanation thereof is omitted. The materials and conditions in the manufacturing process are substantially identical to those of the first embodiment and detailed explanation thereof is herein omitted.

Figure 5A:
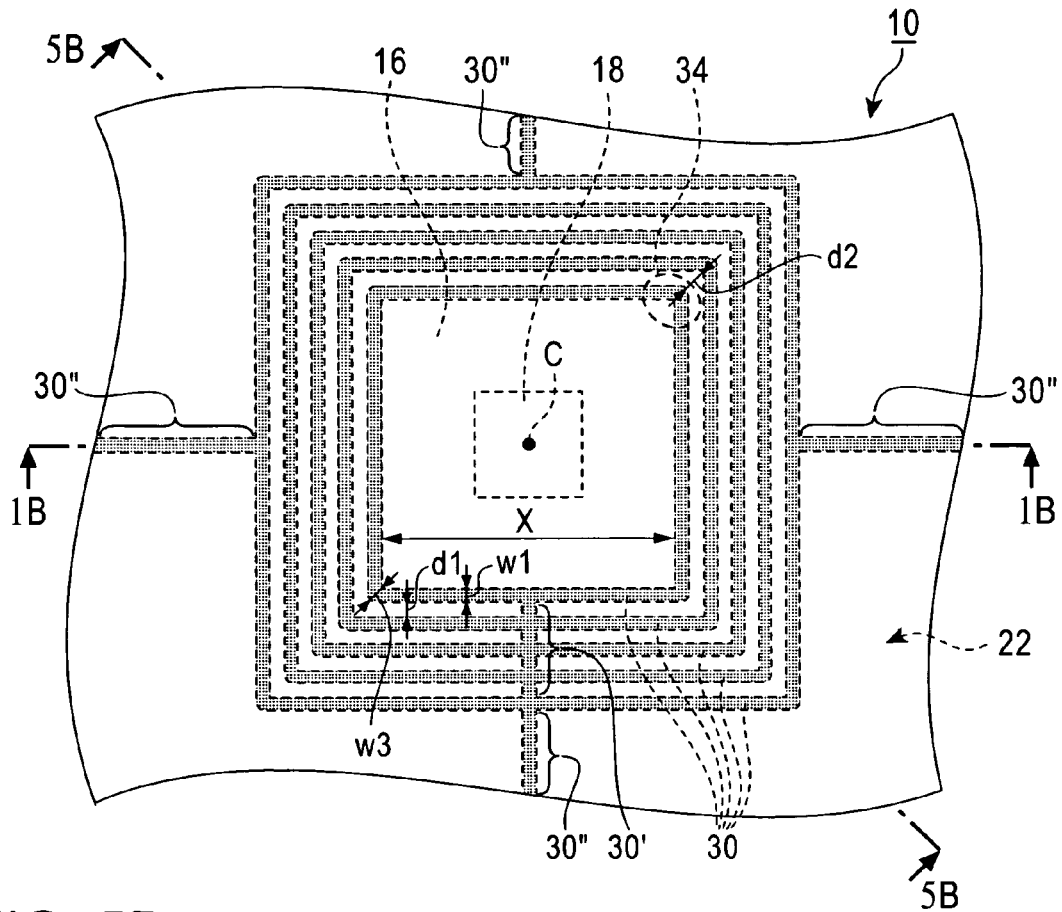
FIG. 5A is a schematic plan view of a semiconductor element according to the second embodiment.

FIG. 5A is a schematic plan view of the semiconductor element 10 of the second embodiment. The arrangement of the constituent elements are particularly depicted.

Figure 5B:
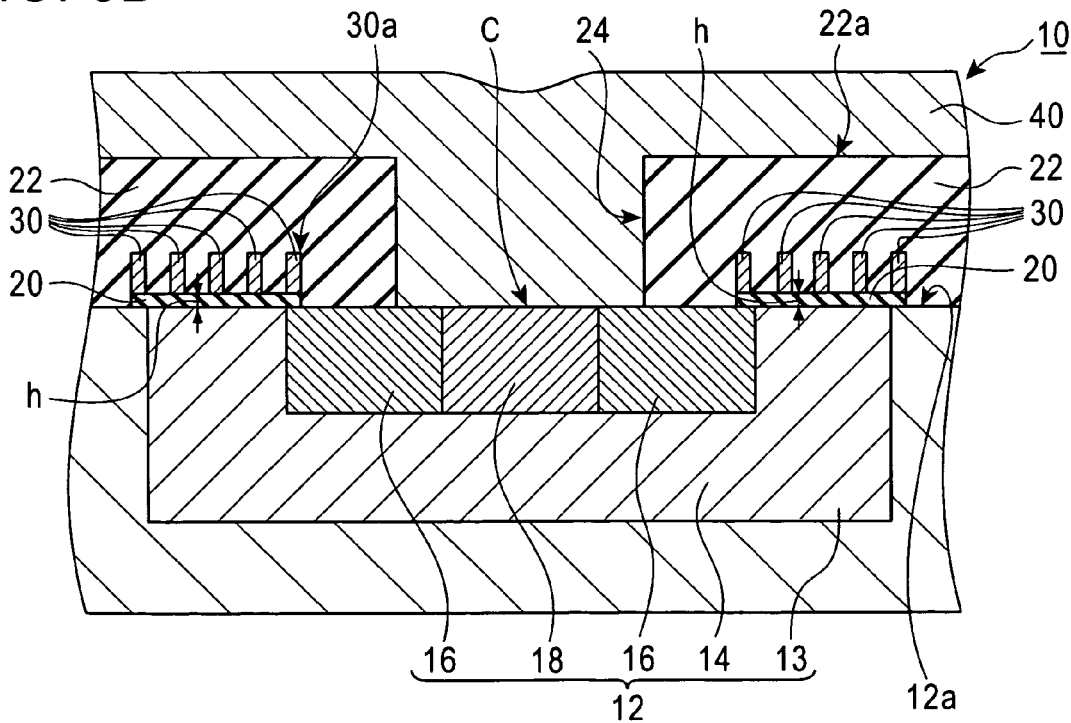
FIG. 5B is a cross-sectional view taken along the line 5B-5B in FIG. 5A.

FIG. 5B is a schematic drawing showing a cut made along the dash-dot line 5B-5B in FIG. 5A. The cut made along a dash-dot line 1B-1B in FIG. 5A is the same as in the first embodiment.

The configuration of the semiconductor element 10 of the second embodiment differs from the configuration of the semiconductor element of the first embodiment shown in FIGS. 1A and 1B only in the shape of gate electrodes 30. Other features of the configuration are substantially the same. Therefore only this difference will be described in greater detail.

As shown in FIGS. 5A and 5B, the semiconductor element 10 of the second embodiment is formed on a substrate 12 of the first conductivity type. A channel diffusion region 14 of the second conductivity type is provided in the substrate 12. This channel diffusion region 14 is surrounded by a substrate 13 of the first conductivity type on the perimeter thereof, except a surface 12a of the substrate 12.

A source contact region 16 of the first conductivity type is provided in the channel diffusion region 14.

Another source contact region 18 of the second conductivity type is provided in the source contact region 16 of the first conductivity type.

A surface insulating film 20 is provided on the channel diffusion region 14 which is exposed in the same plane with the surface 12a of the substrate 12.

A gate electrode is provided on the surface insulating film 20. The gate electrode includes a plurality of linear gate electrodes 30. The gate electrodes 30 surround the central point C in a multiple fashion with a spacing therebetween. Thus, the gate electrodes 30 are provided in the form of closed loops concentrically surrounding the central point C. Each gate electrode 30 has a width less than the width of the surface insulating film 20 (i.e., the width of the rectangular loop). The gate electrodes 30 have the same width w1 in the direction perpendicular to the extending direction of the gate electrodes 30. The gate electrodes 30 are provided with equal spacing.

The gate electrodes 30 have curved portions 34. In this embodiment, each of the gate electrodes 30 has a substantially rectangular shape with four curved portions 34.

The shape of the curved portions 34 is a feature of the semiconductor element 10 of this embodiment. The curved portions 34 are so formed that a wider spacing d2 is defined between the adjacent curved portions 34 than in the first embodiment. The corners 34 of the gate electrode 30 are the curves in the present embodiment whereas the corners of the gate electrode are the right angle corners in the first embodiment.

Thus, each of the linear gate electrodes 30 of this embodiment is provided in the form of a polygonal loop having the curved portions 34. The outer edge of each curved portion 34 has a curved shape.

If the outer side of the curved portion 34 has a right-angle contour as shown in FIG. 1 (first embodiment), the spacing d2 between the gate electrodes 30 in the diagonal direction is a value obtained by multiplying the width d1 by $2^{1/2}$. However, in the present embodiment, the spacing d2 at the corner is made larger than the width d1 multiplied by $2^{1/2}$ by decreasing the width w3 of the gate electrode 30 in the diagonal direction. The width w3 is almost equal to the width w1. Thus, the spacing between the curved portions 34 of the adjacent gate electrodes 30 is increased.

The shape that provides for the enlargement of the spacing d2 is not limited to the above-described shape. For example, the spacing d2 is enlarged by employing bell shape corners such that the curved portions 34 protrude outward of the semiconductor element 10.

The gate electrodes 30 are linked to each other by a linking portion 30'.

One end of a connecting portion 30" is connected to the outermost gate electrode 30 of the linear gate electrodes 30. The other end of the connecting portion 30" is connected to a gate electrode of the adjacent semiconductor element (not shown in the figure). Similar to the gate electrodes 30 and linking portion 30', the connecting portions 30" are electrically insulated from the N$^-$-type region 13 by the surface insulating film 20.

An intermediate insulating film 22 is formed so as to cover the surface 12a of the substrate 12, gate electrodes 30, and the surface insulating film 20 exposed from the gate electrodes 30.

A contact hole 24 is provided in the intermediate insulating film 22 from the surface 22a thereof so as to reach the source contact region 18 and part of the source contact region 16.

An electrode wiring 40 for filling the contact hole 24 is provided on the intermediate insulating film 22.

The semiconductor element of the second embodiment can demonstrate the same effect as the first embodiment, and also can make the concentration of dopants that are introduced and diffused in the region close to the curved portions 34, equal to the concentration of dopants in the other regions. In the conventional configurations, the threshold voltage decreases in the region close to the curved portions 34 due to nonuniformity of dopant concentration. In this embodiment, however, the threshold voltage in this region can be raised and made equal to that in the other regions. Therefore, no microcurrent flows during ON and OFF operation of the semiconductor element. As a result, the so-called switching characteristic can be improved.

2-2. Method for Manufacture of Semiconductor Element

A method for manufacturing the semiconductor element 10 of the second embodiment (FIGS. 5A and 5B) will be described below. The materials and conditions in the manufacturing steps other than the step of forming the gate electrodes 30 can be identical to those of the first embodiment. Therefore, detailed explanation thereof is omitted.

Similar to the first embodiment, a substrate 12 of the first conductivity type is prepared. In this process, a region where the semiconductor element 10 will be formed is set as a preset region (center C) on the substrate 12.

Then, a surface insulating film 20 in the form of a closed loop is formed on the surface of the substrate 12 by conducting the conventional thermal oxidation treatment in an oxygen atmosphere.

Subsequently, gate electrodes 30 are formed on the surface insulating film 20 by the CVD process, photolithography process and dry etching process, preferably, with polysilicon as a material for the gate electrodes. The CVD process creates the film and the photolithography and dry etching create the pattern. The mask (e.g., resist) used in this patterning has a shape suited for the formation of the gate electrodes 30.

The gate electrodes 30, linking portion 30', and connecting portions 30" are formed as a single continuous pattern in the same process and from the same material. Similar to the gate electrodes 30 and linking portion 30', the connecting portions 30" are electrically insulated from the N$^-$-type region 13 by the surface insulating film 20.

Then, similar to the first embodiment, ion implantation is conducted into the substrate 12 by using a mask pattern that opens only the region (shown as region X in FIG. 5A) surrounded by the gate electrodes 30, that is, the region inside the innermost gate electrode 30. The conditions of ion implantation and thermal diffusion are the same as in the first embodiment.

The channel diffusion region 14, source contact region 16, and source contact region 18 are then successively formed by the same processes as used in the first embodiment.

Similar to the first embodiment, the intermediate insulating film 22 is formed so as to cover the gate electrodes 30, surface insulating film 20 exposed from the gate electrodes 30, and the surface 12a of the substrate 12. The intermediate insulating film 22 is formed so as to fill the gaps between the gate electrodes 30.

The contact hole 24 is then formed in the same manner as in the first embodiment.

The electrode wiring 40 for filling the contact hole 24 is then formed on the intermediate insulating film 22 by a common process.

The semiconductor element 10 of the second embodiment is thus formed.

With the manufacturing method of the second embodiment, the concentration of dopants in the region close to the curved portion 34 is made lower than that in other regions by forming the curved portions 34 with a wider spacing therebetween. By reducing the reverse capacity of the channel portion when a voltage is applied to the gate electrodes in the region close to the curved portion 34, it is possible to obtain the same threshold voltage in the region close to the curved portion 34 and in the regions other than the region close to the curved portion 34. As a result, the switching characteristic of the semiconductor element is improved.

Third Embodiment:

3-1. Configuration of Semiconductor Element

The configuration of the semiconductor element 10 of the third embodiment will be described below with reference to FIGS. 6A and 6B. The constituent elements similar or identical to the constituent elements that have already been described in the first embodiment are assigned with the same reference symbols and detailed explanation thereof is omitted. The materials and conditions in the manufacturing process are substantially identical to those of the first embodiment and detailed explanation thereof is herein omitted.

Figure 6A:
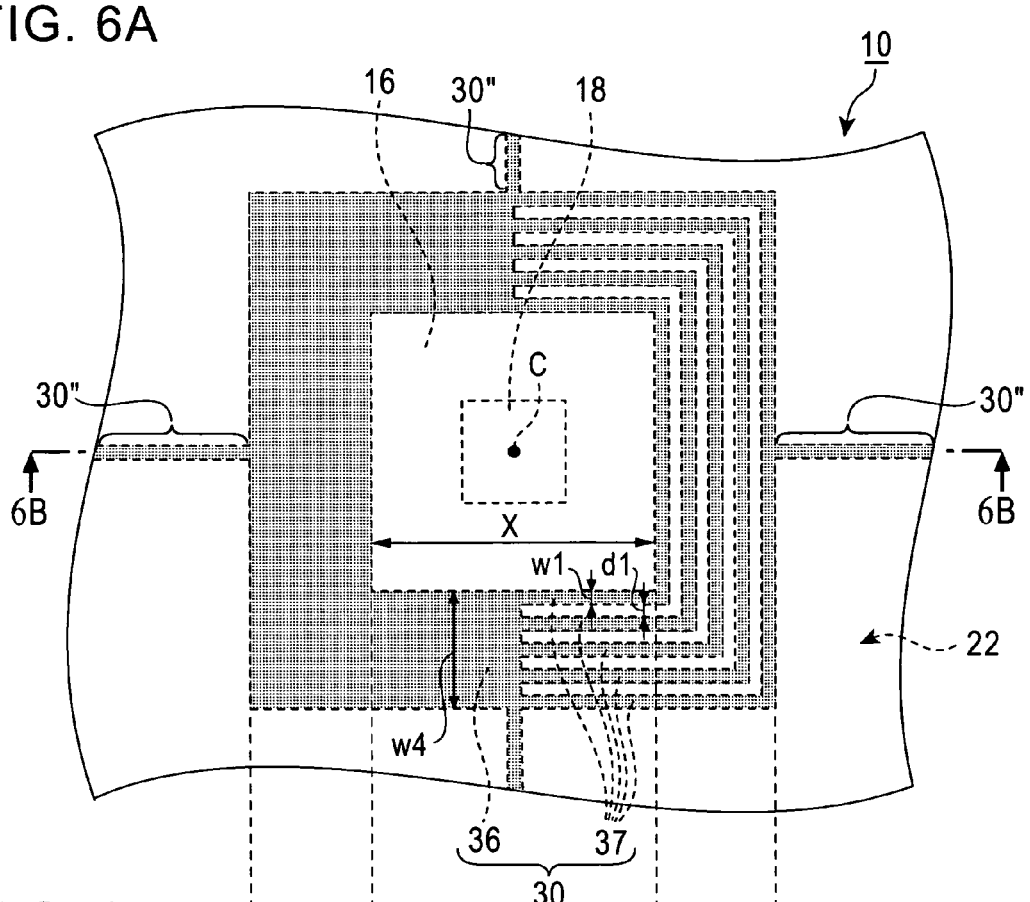
FIG. 6A is a schematic plan view of a semiconductor element according to the third embodiment.

FIG. 6A is a schematic plan view of constituent elements of the semiconductor element 10 according to the third embodiment.

Figure 6B:
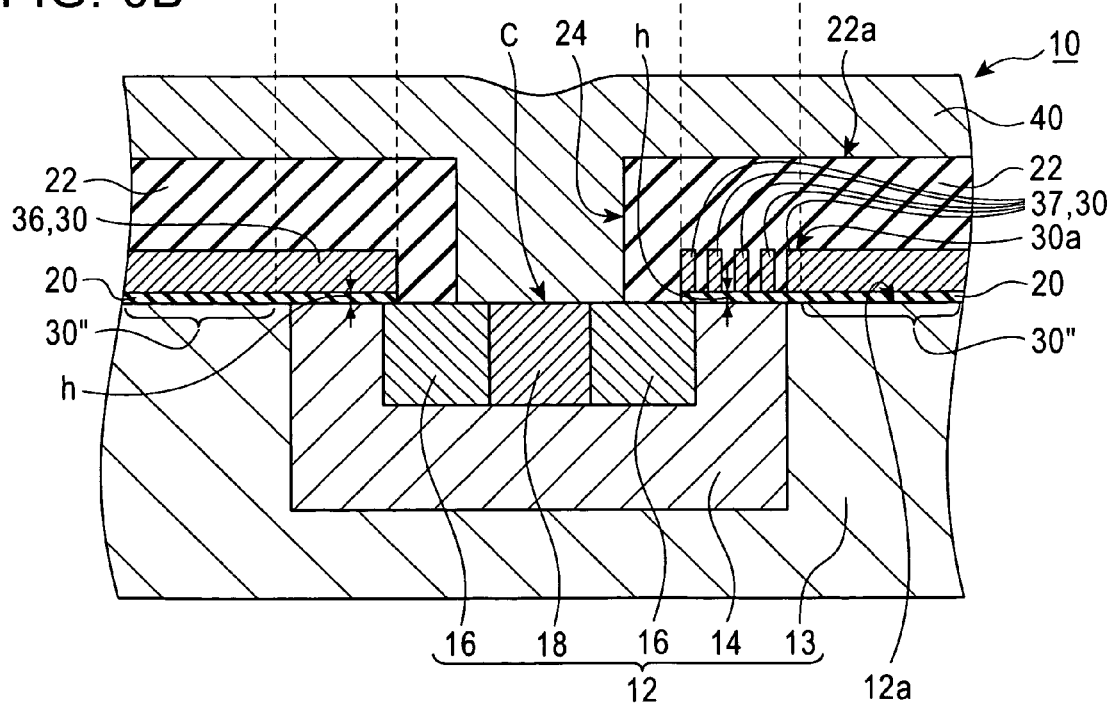
FIG. 6B is a cross-sectional view taken along the line 6B-6B in FIG. 6A.

FIG. 6B is a schematic cross sectional view taken along the dash-dot line 6B-6B in FIG. 6A.

The configuration of the semiconductor element 10 of the third embodiment differs from the configuration of the semiconductor element of the first embodiment (FIGS. 1A and 1B) only in the shape of gate electrodes 30. Other features of the configuration are substantially the same. Therefore only this difference will be described in greater detail.

As shown in FIGS. 6A and 6B, the semiconductor element 10 of the third embodiment is formed on a substrate 12 of the first conductivity type. A channel diffusion region 14 of the second conductivity type is provided in the substrate 12 of the first conductivity type. This channel diffusion region 14 is surrounded by the region 13 of the first conductivity type on the perimeter thereof, except the surface 12a of the substrate 12.

A source contact region 16 of the first conductivity type is provided in the channel diffusion region 14.

Another source contact region 18 of the second conductivity type is provided in the source contact region 16.

A surface insulating film 20 is provided on the channel diffusion region 14 which is exposed in the same plane with the surface 12a of the substrate 12.

A gate electrode 30 is provided on the surface insulating film 20. The gate electrode 30 as a whole surrounds the central point C of the source contact region 18. The gate electrode 30 has a shape of a closed loop.

The gate electrode 30 of this embodiment has a shape in which two regions are combined on the surface insulating film 20, one region being a first region 36 provided with a width equal to that of the surface insulating film 20 and the other region being a second region 37 in the form of a plurality of lines similar to those of the above-described embodiments.

The first region 36 is provided with a width w4 equal to that of the rectangular loop of the surface insulating film 20. The first region 36 occupies approximately half of the surface area of the surface insulating film 20 and has a substantially C-like shape. A plurality of linear gate electrodes are provided as the second region 37 of the gate electrode 30 on the remaining half surface area of the surface insulating film 20. In this embodiment, these gate electrodes are provided separately with an equal spacing d1 therebetween. All the gate electrodes are provided with the same width w1. Each of the gate electrodes has a turned U-like shape, and both ends thereof are linked to the end portions of the first region 36.

One end of a connecting portion 30" is connected to the gate electrode 30. As describe above, the first region 36 and a plurality of linear gate electrodes of the second region 37 are linked to each other. Therefore, the connection portion 30" is coupled to either the outer side of the first region 36 or to the outermost side (outermost linear gate electrode) of the second region 37. The other end of the connecting portion 30" is connected to a gate electrode of the adjacent semiconductor element (not shown in the figure). Similar to the gate electrode 30 and linking portion 30', the connecting portions 30" are electrically insulated from the N⁻-type region 13 by the surface insulating film 20.

An intermediate insulating film 22 is formed so as to cover the surface 12a of the substrate 12, gate electrode 30, and the surface insulating film 20 exposed from the gate electrode 30.

A contact hole 24 is provided in the intermediate insulating film 22 from the surface 22a thereof so as to reach the source contact region 18 and part of the source contact region 16.

An electrode wiring 40 for filling the contact hole 24 is provided on the intermediate insulating film 22.

The relationship between the current-voltage characteristic of the semiconductor element 10 of the third embodiment and the shape of the gate electrode 30 will be described herein with reference to FIG. 7.

Figure 7:
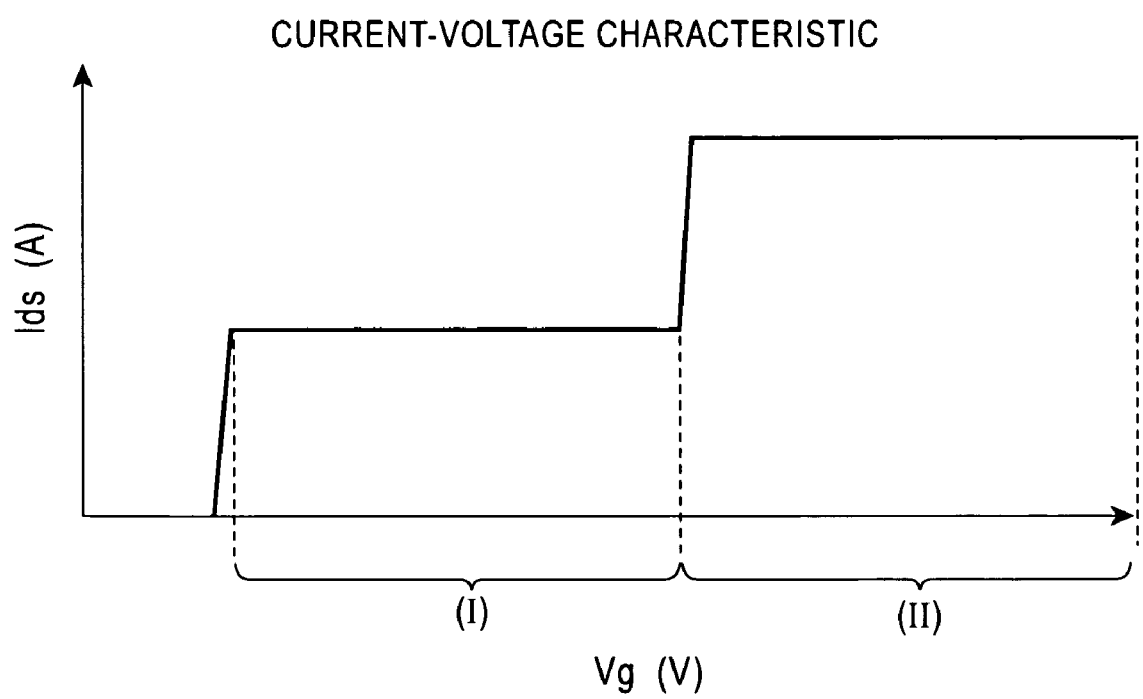
FIG. 7 is a graph of the current-voltage characteristic of a semiconductor element.

FIG. 7 is a schematic graph to explain the current-voltage characteristic of the semiconductor element 10. An electric current (Ids) (A: ampere) between the source and the drain is plotted against the ordinate, and a voltage (Vg) (V: volts) of the gate electrode is plotted against the abscissa.

As shown in FIG. 7, if a voltage is applied to the gate electrode 30, then, first, the conductivity type of the region directly below the first region 36 is inverted by the voltage applied to the first region 36, and a current of an amplitude shown in the region I flows between the source and the drain. Then, due to the inversion of conductivity type in the region below the linear gate electrodes of the second region 37, an electric current of an amplitude shown in the region II flows between the source and the drain.

The characteristic of the semiconductor element shown in FIG. 7 can be controlled as desired by adjusting, for example, the width d1 and/or the size of the first region 36 on the surface insulating film 20. For example, if the width d1 is increased, the voltage in the region II shown in FIG. 7 can be raised. If the area on the surface insulating film 20 that is occupied by the first region 36 is decreased, the electric current flowing in the region I shown in FIG. 7 can be reduced.

Thus, with the semiconductor element of the third embodiment, in addition to the effect obtained by the first embodiment, the current of the semiconductor element can have two levels during operation. Therefore, the occurrence of the so-called inrush current, which is the problem in the semiconductor elements with the conventional structures, can be effectively prevented.

3-2. Method for Manufacture of Semiconductor Element

A method for manufacturing the semiconductor element 10 of the third embodiment (FIGS. 6A and 6B) will be described below. The materials and conditions in the manufacturing steps other than the step of forming the gate electrodes 30 can be identical to those of the first embodiment. Therefore, detailed explanation thereof is omitted.

Similar to the first embodiment, a substrate 12 of the first conductivity type is prepared. In this process, a region (center C) where the semiconductor element 10 will be formed is set as a preset region on the substrate 12.

Then, a surface insulating film 20 in the form of a closed loop is formed on the surface of the substrate 12 by conducting the thermal oxidation treatment in an oxygen atmosphere.

Subsequently, the gate electrode 30 is formed on the surface insulating film 20, for example, by the CVD process, photolithography process and dry etching process, preferably, with polysilicon as a material for the gate electrodes. The CVD process creates the film, and the photolithography process and etching process create the pattern. The mask (e.g., resist) used in this patterning has a shape allowing for the formation of the first region 36, linear gate electrodes of the second region 37, linking portion 30', and connection portion 30".

Thus, the first region 36, linear gate electrodes of the second region 37, linking portion 30', and connection portion 30" are formed as a single continuous pattern in the same process and from the same material.

Then, similar to the first embodiment, ion implantation is conducted into the substrate 12 by using a mask pattern (resist pattern) that opens only the region (shown as region X in FIG. 6A) surrounded by the gate electrode 30, that is, the region inside the first region 36 and also inside the innermost linear gate electrode of the second region 37. The conditions of ion implantation and thermal diffusion are the same as in the first embodiment.

Then, channel diffusion region 14 of the second conductivity type, source contact region 16 of the first conductivity type, and source contact region 18 of the second conductivity type are successively formed by the same processes as used in the first embodiment.

Similar to the first embodiment, the intermediate insulating film 22 is formed so as to cover the gate electrode 30, surface insulating film 20 exposed from the gate electrodes 30, and the surface 12a of the substrate 12. The intermediate insulating film 22 is formed so as to fill the gaps between the linear gate electrodes in the second region 37.

The contact hole 24 is then formed in the same manner as in the first embodiment.

The electrode wiring 40 for filling the contact hole 24 is then formed on the intermediate insulating film 22 by a common process.

Fourth Embodiment:

4-1. Configuration of Semiconductor Element

The configuration of the semiconductor element 10 of the fourth embodiment will be described below with reference to FIGS. 8A and 8B. The constituent elements similar or identical to the constituent elements that have already been described in the first embodiment are assigned with the same reference symbols and detailed explanation thereof is omitted. The materials and conditions in the manufacturing process are substantially identical to those of the first embodiment and detailed explanation thereof is herein omitted.

Figure 8A:
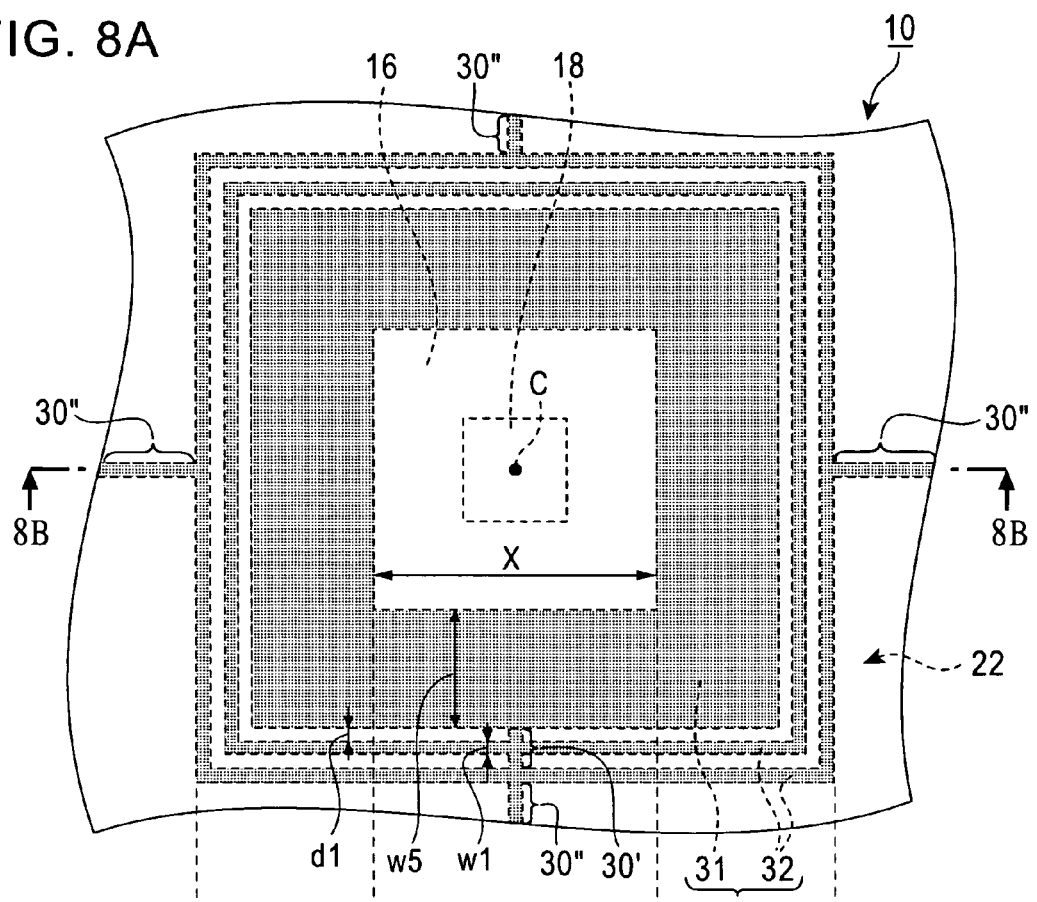
FIG. 8A is a schematic plan view of a semiconductor element according to the fourth embodiment.

FIG. 8A is a schematic plan view of the semiconductor element 10 of the fourth embodiment.

Figure 8B:
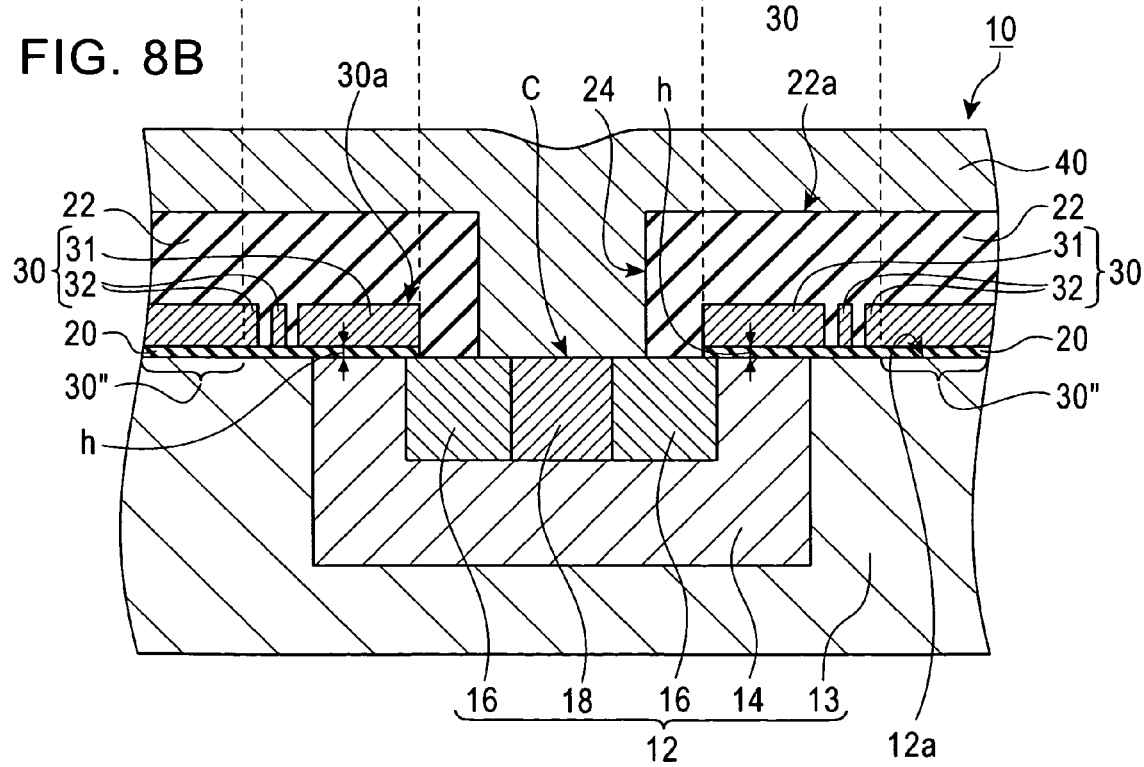
FIG. 8B is a cross-sectional view taken along the line 8B-8B in FIG. 8A.

FIG. 8B is a schematic drawing showing a cut made along the dash-dot line 8B-8B in FIG. 8A.

The configuration of the semiconductor element 10 of the fourth embodiment differs from the configuration of the semiconductor element of the first embodiment (FIGS. 1A and 1B) only in the shape of gate electrodes 30. Other features of the configuration are substantially the same. Therefore only this difference will be described in greater detail.

As shown in FIGS. 8A and 8B, the semiconductor element 10 of the fourth embodiment is formed on a substrate 12 of the first conductivity type. A channel diffusion region 14 of the second conductivity type is provided in the substrate 12. The channel diffusion region 14 is surrounded by the region 13 of the first conductivity type on the perimeter thereof, except the surface 12a of the substrate 12.

A source contact region 16 of the first conductivity type is provided in the channel diffusion region 14 of the second conductivity type.

Another source contact region 18 of the second conductivity type is provided in the source contact region 16 of the first conductivity type.

A surface insulating film 20 is provided on the channel diffusion region 14 which is exposed in the same plane with the surface 12a of the substrate 12.

A gate electrode 30 is provided on the surface insulating film 20. The gate electrode 30 as a whole surrounds the central point C of the source contact region 18. The gate electrode 30 has a shape of a closed loop.

The gate electrode 30 of this embodiment is composed mainly of two regions having a linear shape. Specifically, the gate electrode 30 includes a first gate electrode 31 and one or a plurality of second gate electrodes 32.

The first gate electrode 31 is located on the surface insulating film 20, stretches from the $N^+$-type source contact region 16 to the $N^-$-type region 13, and has a width w5. The first gate electrode 31 has a shape of a closed loop.

The second gate electrode 32 is provided on the region 13 and outside the first gate electrode 31.

As shown in the figure, each of the two second gate electrodes 32 surrounds the first gate electrode 31. The two second gate electrodes 32 are provided in the form of concentric linear closed loops. The surface insulating film 20 extends under the second gate electrodes 32. The part of the surface insulating film 20 directly below the second gate electrodes 32 may be patterned as an independent region separated from the part of the surface insulating film 20 located directly below the first gate electrode 31.

The second gate electrodes 32 are narrower than the first gate electrode 31 and are provided with the same width w1. In this embodiment, equal spacing d1 is provided between the second gate electrodes 32 and between the first gate electrode 31 and second gate electrode 32.

The first gate electrode 31 and second gate electrodes 32 are linked to each other by a linking portion 30'.

One end of a connecting portion 30" is connected to the gate electrode 30. In this embodiment, it is connected to the second gate electrode 32 positioned on the outermost side. The other end of the connecting portion 30" is connected to a gate electrode of the adjacent semiconductor element (not shown in the figure). The connecting portion 30" is electrically insulated from the N⁻-type region 13 by the surface insulating film 20.

An intermediate insulating film 22 is provided on the surface 12a of the substrate 12 and gate electrodes 30 so as to cover those components.

A contact hole 24 is provided in the intermediate insulating film 22 from the surface 22a thereof so as to reach the source contact region 18 and part of the source contact region 16.

An electrode wiring 40 for filling the contact hole 24 is provided on the intermediate insulating film 22.

With the configuration of the semiconductor element 10 according to the fourth embodiment, the second gate electrodes 32 are provided in the form of concentric linear closed loops so as to surround the first gate electrode 31. Therefore, electric resistance of the region around the channel can be decreased during operation. As a result, the semiconductor element 10 can operate at a higher speed.

4-2. Method for Manufacture of Semiconductor Element

A method for the manufacture of the semiconductor element 10 of the fourth embodiment (FIGS. 8A and 8B) will be described below. The materials and conditions in the manufacturing steps other than the step of forming the gate electrodes 30 can be identical to those of the first embodiment. Therefore, detailed explanation thereof is omitted.

Similar to the first embodiment, a substrate 12 of the first conductivity type is prepared. In this process, a region (center C) where the semiconductor element 10 will be formed is set as a preset region on the substrate 12.

Then, a surface insulating film 20 in the form of a plurality of closed loops is formed on the surface of the substrate 12 by conducting the thermal oxidation treatment in an oxygen atmosphere.

Then, the gate electrode 30 is formed, for example, by the CVD process, photolithography process and dry etching process, preferably, with polysilicon as a material for the gate electrodes. The mask (resist) used in this process has a shape allowing for the formation of the first gate electrode 31, second gate electrodes 32, linking portion 30', and connection portion 30".

Specifically, the mask is formed which has an opening to expose the surface insulating film 20 and also a region extending from the surface insulating film 20 where the linking portion 30' and connection portion 30" will be formed.

Thus, the first gate electrode 31, second gate electrodes 32, linking portion 30', and connection portion 30" are formed as a single continuous pattern in the same process and from the same material.

Then, similar to the first embodiment, ion implantation is conducted into the substrate 12 by using a mask pattern that opens only the region (shown as region X in FIG. 8A) surrounded by the gate electrode 30, that is, the region inside the first gate electrode 31. The conditions of ion implantation and thermal diffusion are the same as in the first embodiment.

Then, channel diffusion region 14 of the second conductivity type, source contact region 16 of the first conductivity type, and source contact region 18 of the second conductivity type are successively formed by the same processes as used in the first embodiment.

Similar to the first embodiment, the intermediate insulating film 22 is formed so as to cover the gate electrode 30, surface insulating film 20 exposed from the gate electrode 30, and the surface 12a of the substrate 12. The intermediate insulating film 22 is formed so as to fill the gaps between the first and second gate electrodes 31 and 32 and between the second gate electrodes 32.

The contact hole 24 is then formed in the same manner as in the first embodiment.

The electrode wiring 40 for filling the contact hole 24 is then formed on the intermediate insulating film 22 by an ordinary method.

According to the above described manufacturing process, the semiconductor element 10 of the fourth embodiment can be made with high efficiency.

Fifth Embodiment:

5-1. Configuration of Semiconductor Element

The configuration of the semiconductor element 10 of the fifth embodiment will be described with reference to FIGS. 9A and 9B. The constituent elements similar or identical to the constituent elements that have already been described in the first embodiment are assigned with the same reference symbols and detailed explanation thereof is omitted. In the explanation of the manufacturing process, the materials and conditions are substantially identical to those of the first embodiment and detailed explanation thereof is herein omitted.

Figure 9A:
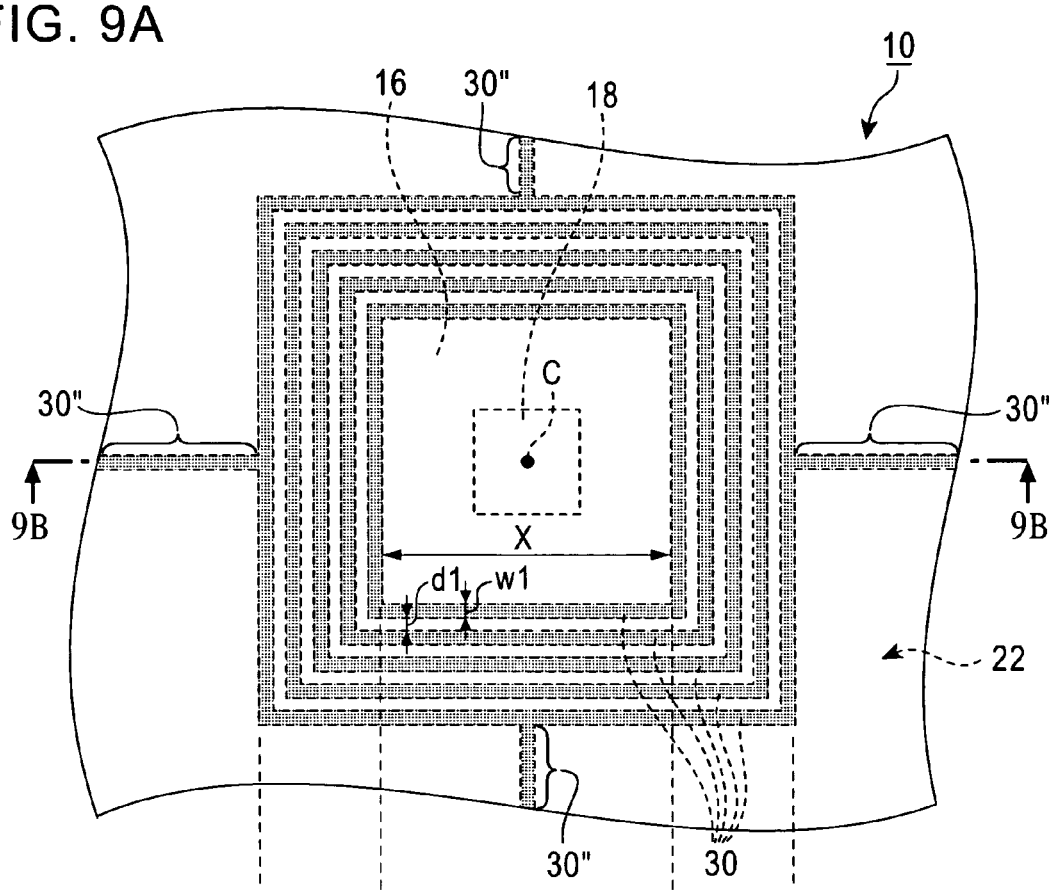
FIG. 9A is a schematic plan view of a semiconductor element according to the fifth embodiment.

FIG. 9A is a schematic plan view of constituent element of the semiconductor element 10 according to the fifth embodiment. In order to facilitate the understanding of the shape of the gate electrode 30, the configuration of the upper side of the semiconductor element including the upper gate electrode 33 is not shown in the figure, so that the configuration below the upper gate electrode 33 can be seen.

Figure 9B:
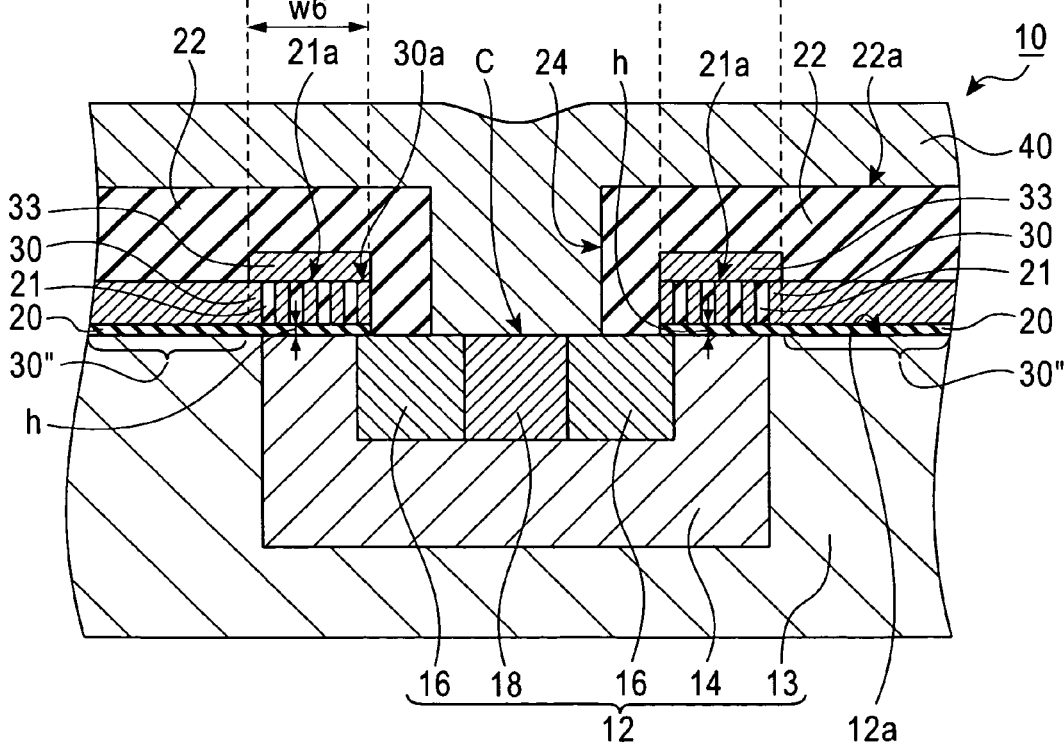
FIG. 9B is a cross-sectional view taken along the line 9B-9B in FIG. 9A.

FIG. 9B is a schematic drawing showing a cut made along the dash-dot line 9B-9B in FIG. 9A.

The configuration of the semiconductor element 10 of the fifth embodiment differs from the configuration of the semiconductor element of the first embodiment (FIGS. 1A and 1B) only in the shape of gate electrodes 30. Other features of the configuration are substantially the same. Therefore only this difference will be described in greater detail.

As shown in FIGS. 9A and 9B, the semiconductor element 10 of the fifth embodiment is formed on a substrate 12 of the first conductivity type. A channel diffusion region 14 of the second conductivity type is provided in the substrate 12. This channel diffusion region 14 is surrounded by the region 13 of the first conductivity type on the perimeter thereof, except for the surface 12a of the substrate 12.

A source contact region 16 of the first conductivity type is provided in the channel diffusion region 14.

Another source contact region 18 of the second conductivity type is provided in the source contact region 16.

A surface insulating film 20 is provided on the channel diffusion region 14 which is exposed in the same plane with the surface 12a of the substrate 12.

A gate electrode in the form of a closed loop is provided on the surface insulating film 20. The gate electrode as a whole surrounds the center C of the source contact region 18.

The gate electrode of this embodiment is composed mainly of two portions, namely, a plurality of linear gate electrodes 30 in the form of a closed loop and an upper gate electrode 33.

The linear gate electrodes 30 concentrically surround the center C of the semiconductor element, that is, the center C of the source contact region 18. This means that the linear gate electrodes 30 surround the center C while being separated from each other.

In this embodiment, the gate electrode includes five linear gate electrodes 30. Each linear gate electrode 30 has a width w1 less than the width of the surface insulating film 20. The surface insulating film 20 has a generally rectangular shape.

The gate electrodes 30 are provided with equal spacing d1 therebetween.

Thus, the configuration of the linear gate electrodes 30 is similar to that of the first embodiment.

The upper gate electrode 33 is provided in contact with the upper surfaces 30a of the gate electrodes 30 and separately from the surface insulating film 20. The upper gate electrode 33 is electrically connected to the linear gate electrodes 30.

The upper gate electrode 33 has the same shape as the surface insulating film 20, that is, a closed loop shape, has a width w6 equal to that of the surface insulating film 20 and extends in parallel to the surface insulating film 20.

The gate electrode 30 of this embodiment has a closed space bounded (defined) by the surface insulating film 20 (bottom surface), linear gate electrodes 30 (side walls), and upper gate electrode 33 (upper surface). There are four gaps (d1) between the linear gate electrodes 30. Therefore, four closed spaces are formed.

A gap insulating film 21 is provided inside each of those closed spaces so as to fill those closed spaces. The upper surface 21a of the gap insulating film 21 has the same height as the upper surface 30a of the linear gate electrodes 30. In other words, the upper surface 21a of the gap insulating film 21 is in contact with the lower surface of the upper gate electrode 33.

The gap insulating film 21 may be, for example, a film of $SiO_2$ or SiN.

One end of a connecting portion 30'' is connected to the gate electrode 30. In this embodiment, it is connected to the gate electrode 30 positioned on the outermost side. The other end of the connecting portion 30'' is connected to a gate electrode of the adjacent semiconductor element (not shown in the figure). The connecting portion 30'' is electrically insulated from the $N^-$-type region 13 by the surface insulating film 20.

An intermediate insulating film 22 is provided on the surface 12a of the substrate 12 and gate electrodes 30 so as to cover those components. The material of the intermediate insulating film 22 may be the same as or different from that of the gap insulating film 21.

A contact hole 24 is provided in the intermediate insulating film 22 from the surface 22a thereof so as to reach the source contact region 18 and part of the source contact region 16.

An electrode wiring 40 for filling the contact hole 24 is provided on the intermediate insulating film 22.

With the configuration of the semiconductor element 10 of the fifth embodiment, there are provided a plurality of linear gate electrodes 30 and the upper gate electrode 33, which is electrically connected to the upper sides of the gate electrodes 30. Therefore, it is possible to improve the uniformity of voltage applied to each linear gate electrode 30, that is, the uniformity of voltage applied to the entire gate electrode. In addition to the effect identical to that of the first embodiment, the fifth embodiment can promise more stable operation of the semiconductor element.

5-2. Method for Manufacture of Semiconductor Element

A method for the manufacture of the semiconductor element 10 of the fifth embodiment (FIGS. 9A and 9B) will be described below with reference to FIGS. 10A, 10B, and 10C and also FIGS. 11A and 11B. The materials and conditions in the manufacturing steps other than the step of forming the gate electrodes 30 can be identical to those of the first embodiment. Therefore, detailed explanation thereof is omitted.

Figure 10A:
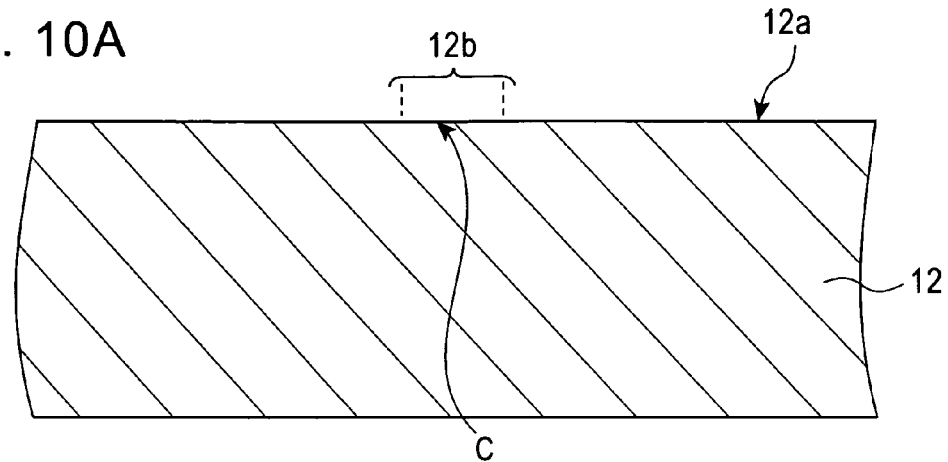
FIGS. 10A, 10B, 10C, 11A and 11B are a series of cross-sectional views of the semiconductor element during the manufacture process, taken along the same line as the line 9B-9B in FIG. 9A.
Figure 10B:
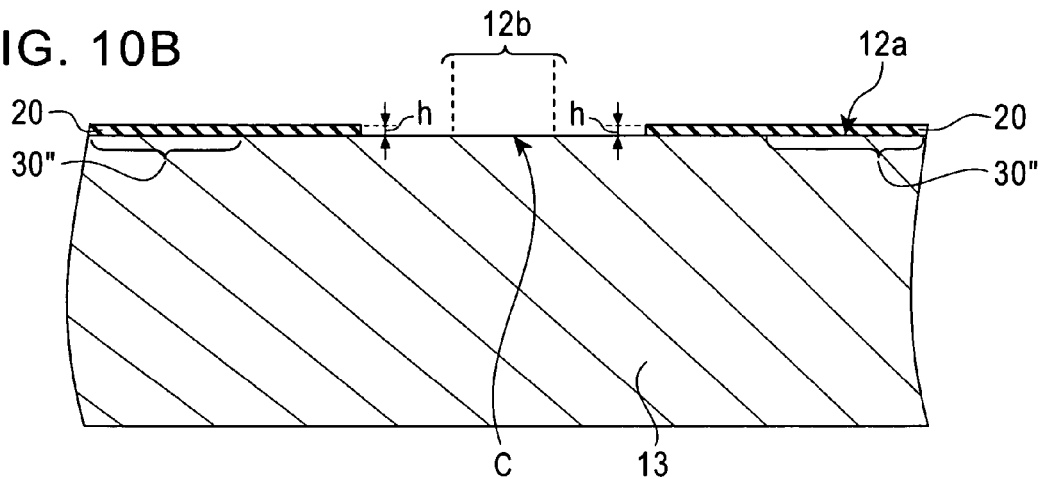
Figure 10C:
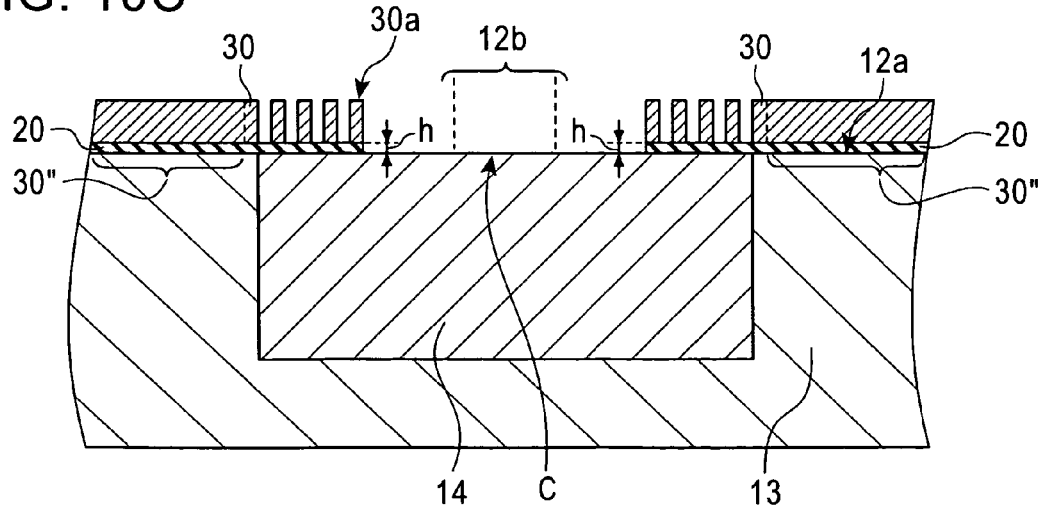

FIGS. 10A, 10B, and 10C are cross sectional views of the semiconductor element in the manufacturing process, taken along the same line as the dash-dot line 9B-9B in FIG. 9A.

Figure 11A:
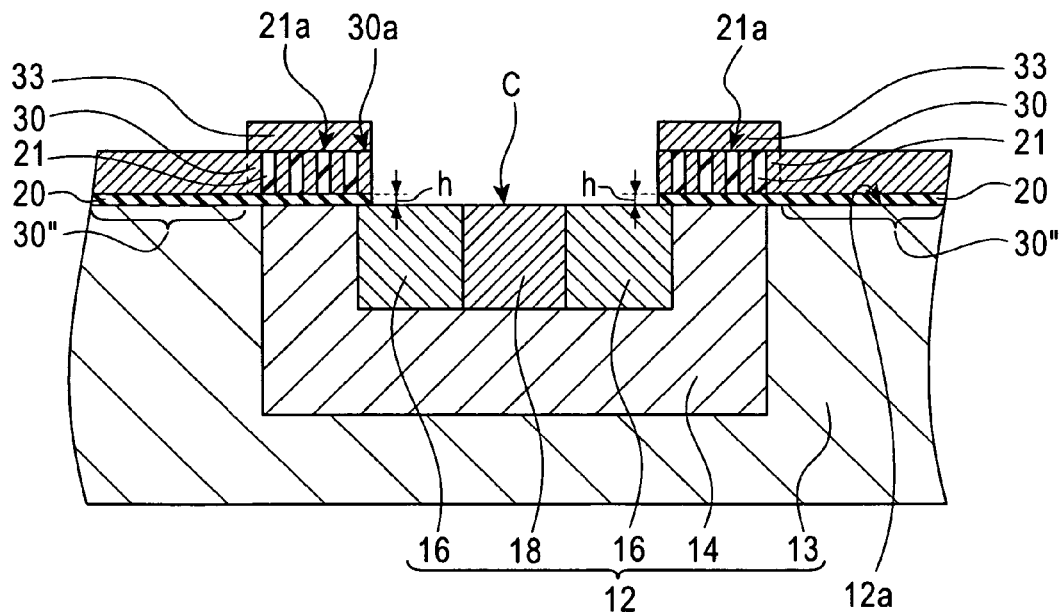
Figure 11B:
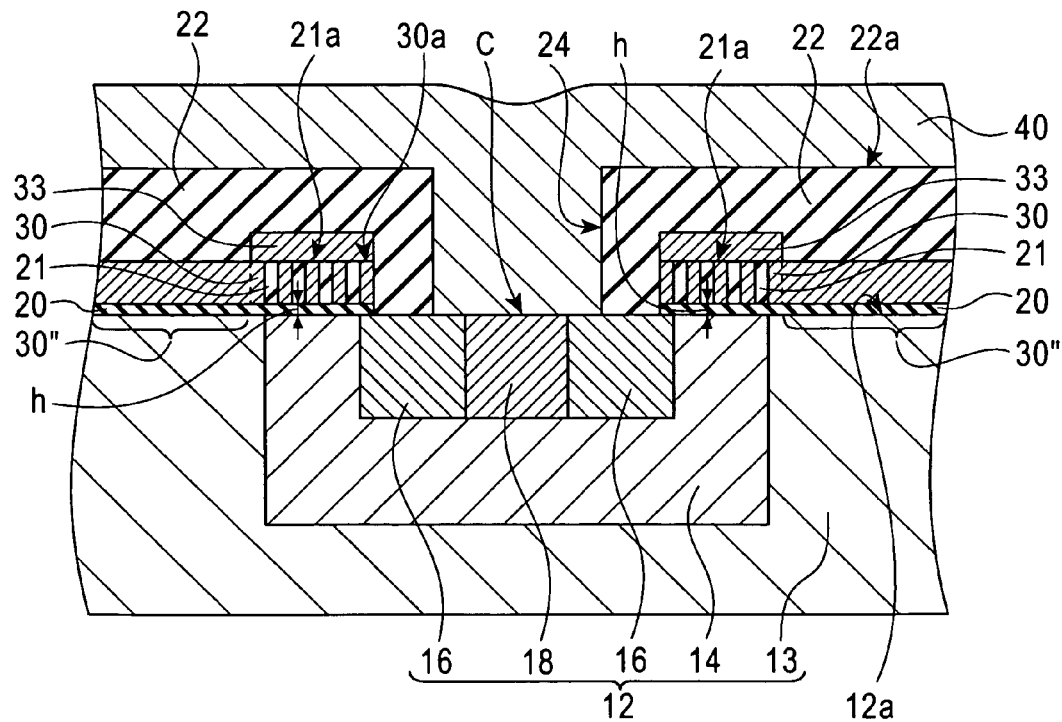

FIGS. 11A and 11B are similar cross sectional views, which shows manufacturing steps after FIG. 10C.

A substrate 12 of the first conductivity type is prepared as shown in FIG. 10A. In this process, a region (center C) where the semiconductor element 10 will be formed is set as a preset region 12b on the substrate 12.

Then, as shown in FIG. 10B, a surface insulating film 20 in the form of a closed loop is formed on the surface of the substrate 12 by conducting the thermal oxidation treatment in an oxygen atmosphere.

Then, the gate electrode is formed, for example, by the CVD process, photolithography process and dry etching process, preferably, with polysilicon as a material for the gate electrodes.

The process for forming the gate electrode of this embodiment is a two-stage process. Specifically, the process for forming a gate electrode includes a process of forming a plurality of linear gate electrodes 30 and connecting portion 30'' (referred to hereinbelow as a first process) and a process of forming the upper gate electrode 33 (referred to hereinbelow as a second process).

The first process is substantially identical to the process of forming the gate electrode 30 described in the first embodiment, except that a linking portion is not formed. Therefore, detailed explanation thereof is omitted.

First, as shown in FIG. 10C, a plurality of linear gate electrodes 30 and the connecting portion 30'' are formed on the surface insulating film 20 by the first process. The connecting portion 30'' is electrically insulated from the $N^-$-type region 13 by the surface insulating film 20.

The mask of resist or the like used in this forming process has a configuration that allows formation of the linear gate electrodes 30 and the connecting portion 30''.

Then, similar to the first embodiment, ion implantation is conducted into the substrate 12 by using a mask pattern that opens only the region (shown as region X in FIG. 9A) surrounded by the gate electrode 30, that is, the region on the inside of the innermost linear gate electrode 30. The conditions of ion implantation and thermal diffusion are the same as in the first embodiment.

Then, as shown in FIG. 11A, the channel diffusion region 14 of the second conductivity type, source contact region 16 of the first conductivity type, and source contact region 18 of the second conductivity type are successively formed by the same processes as used in the first embodiment.

The gaps (d1) between the linear gap electrodes 30 are then filled with an insulating material such as $SiO_2$ and SiN by the masking process and film forming process so as to form the gap insulating film 21. In this process, the gap insulating film 21 is formed so that the height of the upper surface 21a thereof is equal to that of the upper surface 30a of the gate electrode 30 and that the upper surface 30a is exposed.

In the subsequent second process, the upper gate electrode 33 is formed. The upper gate electrode 33 is formed by the usual method by using a material, such as polysilicon, which is identical to the material of the gate electrode 30, on the flat surface formed by the upper surface 21a of the gate insulating film 21 and the upper surface 30a of the gate electrode 30.

Similar to the first embodiment, the intermediate insulating film 22 is formed so as to cover the gate electrode and the surface 12a of the substrate 12, as shown in FIG. 11B.

The contact hole 24 is then formed in the same manner as in the first embodiment.

The electrode wiring 40 for filling the contact hole 24 is then formed on the intermediate insulating film 20 by a common process.

According to the above described manufacturing process, a device equipped with the semiconductor element 10 can be made in an efficient manner.

In the above-described embodiments, the explanation is conducted with respect to a gate electrode of the VDMOS, but the present invention is also applicable to DMOS.

In the above-described embodiments, the explanation is conducted with respect to a gate electrode of the so-called N-type MOS transistor, but the present invention is also applicable to P-type MOS transistors.

In the above-described embodiments, the explanation is conducted with respect to a gate electrode of the so-called enhancement-type MOS transistor, but the present invention is also applicable to depression-type MOS transistors.

In the first, third, and fourth embodiments, the explanation is conducted with respect to a gate electrode of the VDMOS, but the present invention is also applicable to any MOS as long as it can be called MOS.

In the above-described embodiments, the explanation is conducted with respect to an example in which a plurality of gate electrodes have linear shape and are separated from each other, but the present invention is also applicable to a configuration in which the gate electrodes are linked together and form, for example, a grid-like structure.

This application is based on Japanese Patent Application No. 2004-165893 filed on Jun. 3, 2004, and the entire disclosure thereof is incorporated herein by reference.

What is claimed is:

1. A field-effect transistor comprising:
   a substrate of a first conductivity type;
   a channel diffusion region of a second conductivity type provided in said substrate;
   a first source contact region of the first conductivity type provided in said channel diffusion region;
   a second source contact region of the second conductivity type provided in said first source contact region;
   an electrode wiring connected to said first source contact region and said second source contact region;
   a surface insulating film provided on said channel diffusion region; and
   a single linear gate electrode provided on said surface insulating film and having a plurality of branching elements arranged parallel to each other, spacing between said branching elements being less than a thickness of said surface insulating film, each of said branching elements having an elongated shape extending vertically from said surface insulating film, said branching elements being electrically connected to each other.

2. The field-effect transistor according to claim 1, wherein said first source contact region surrounds said second source contact region, said channel diffusion region surrounds said second source contact region, said surface insulating film surrounds said first source contact region, and each of said branching elements forms a loop surrounding said second source contact region.

3. The field-effect transistor according to claim 2, wherein a width of an innermost one of said branching elements is larger than a width of other branching elements.

4. The field-effect transistor according to claim 2, wherein:
   said branching elements are provided in the form of a plurality of concentric polygonal loops, each said polygonal loop having curved portions and straight portions; and
   an outer edge of each said curved portion of each said branching element is curved so that spacing between the curved portions of two adjacent branching elements is wider than spacing between the straight portions of two adjacent branching elements.

5. The field-effect transistor according to claim 2, wherein at least one of said branching elements has a width equal to a width of said surface insulating film.

6. The field-effect transistor according to claim 2, wherein, an innermost one of said plurality of branching elements has a width larger than a width of other linear gate electrodes and covers said channel diffusion region.

7. The field-effect transistor according to claim 2 further comprising:
   an upper gate electrode which has a same width as said surface insulating film, is in contact with upper surfaces of said branching elements, and defines a closed space between said branching elements; and
   a gap insulating film for filling said closed space.

8. The field-effect transistor according to claim 2, wherein:
   said branching elements are provided in the form of a plurality of concentric polygonal loops, each said polygonal loop having curved portions and straight portions; and
   an outer edge of each said curved portion of each said branching element is curved so that spacing between the curved portions of two adjacent branching elements is at least $2^{1/2}$ times larger than spacing between the straight portions of two adjacent branching elements.

9. The field-effect transistor according to claim 1, wherein said second source contact region has a lower surface which reaches said channel diffusion region.

10. The field-effect transistor according to claim 1, wherein said branching elements have a same width.

11. The field-effect transistor according to claim 1, wherein said branching elements are provided with equal spacing therebetween.

12. The field-effect transistor according to claim 1, wherein the second source contact region is provided in said first source contact region such that a current flows in parallel to the substrate.

13. The field-effect transistor according to claim 1, wherein:
   said branching elements are provided in the form of a plurality of loops;
   said second source contact region is rectangular;
   each loop is concentric about the center of the second source contact region; and
   the second source contact region is disposed inside an innermost loop of said branching elements.

14. The field-effect transistor according to claim 1, wherein:
   said surface insulating film has a linear closed loop shape surrounding said second source contact region; and
   an innermost portion of said surface insulating film is disposed to overlap an outermost portion of said first source contact region.

15. The field-effect transistor according to claim 14, wherein:
   said branching elements are provided in the form of a plurality of loops; and an innermost loop of said branching elements is provided on said innermost portion of said surface insulating film that overlaps said outermost portion of said first source contact region.

16. The field-effect transistor according to claim 14, further comprising a drain region of the first conductivity type surrounding said channel diffusion region, wherein:
 said branching elements are provided in the form of a plurality of loops; and
 an outermost loop of said branching elements is provided on a portion of said surface insulating film that overlaps said drain region.

17. The field-effect transistor according to claim 14, wherein:
 said branching elements are provided in the form of a plurality of loops, including an innermost loop, an outermost loop, and intermediate loops between the innermost and outermost loops; and
 said intermediate loops are provided on a portion of said surface insulating film that overlaps channel diffusion region.

* * * * *